(12) United States Patent
Tsuji

(10) Patent No.: US 11,244,711 B2
(45) Date of Patent: Feb. 8, 2022

(54) SEMICONDUCTOR APPARATUS AND METHOD FOR CONTROLLING SEMICONDUCTOR APPARATUS

(71) Applicant: Kioxia Corporation, Minato-ku (JP)

(72) Inventor: Nobuhiro Tsuji, Yokohama (JP)

(73) Assignee: Kioxia Corporation, Minato-ku (JP)

( * ) Notice: Subject to any disclaimer, the term of this patent is extended or adjusted under 35 U.S.C. 154(b) by 0 days.

(21) Appl. No.: 16/816,731

(22) Filed: Mar. 12, 2020

(65) Prior Publication Data

US 2021/0074342 A1 Mar. 11, 2021

(30) Foreign Application Priority Data

Sep. 6, 2019 (JP) .............................. JP2019-163202

(51) Int. Cl.
*G11C 5/06* (2006.01)
*G11C 7/22* (2006.01)
*G11C 7/10* (2006.01)
*H01L 25/065* (2006.01)

(52) U.S. Cl.
CPC ............ *G11C 7/227* (2013.01); *G11C 7/1006* (2013.01); *H01L 25/0657* (2013.01)

(58) Field of Classification Search
CPC .......... G11C 2207/2254; G11C 29/028; G11C 7/1006
See application file for complete search history.

(56) References Cited

U.S. PATENT DOCUMENTS

| 8,525,609 | B1 | 9/2013 | Sadasivam et al. |
| 8,661,188 | B2 | 2/2014 | Huang |
| 9,570,182 | B1 | 2/2017 | Yanagidaira et al. |
| 2010/0083028 | A1* | 4/2010 | Oh ............................ G06F 1/08 713/601 |
| 2013/0033946 | A1* | 2/2013 | Ware ..................... G11C 29/023 365/193 |
| 2015/0363342 | A1 | 12/2015 | Tuers et al. |
| 2018/0076983 | A1 | 3/2018 | Yamamoto et al. |

FOREIGN PATENT DOCUMENTS

| JP | 2010-527059 A | 8/2010 |
| JP | 2018-45743 A | 3/2018 |
| JP | 2018-206389 A | 12/2018 |

OTHER PUBLICATIONS

Kim, H.-J. et al., "1GB/s 2Tb NAND Flash Multi-Chip Package with Frequency-Boosting Interface Chip," 2015 IEEE International Solid-State Circuits Conference, Session 7.6, 2015, pp. 1-29.

* cited by examiner

*Primary Examiner* — Uyen Smet
(74) *Attorney, Agent, or Firm* — Oblon, McClelland, Maier & Neustadt, L.L.P.

(57) ABSTRACT

According to one embodiment, there is provided a semiconductor apparatus including a first chip and a second chip. The first chip is electrically connected to a terminal to which a signal from a host device is input. The second chip is electrically connected to the first chip. The second chip has a first duty adjustment circuit. The first chip has a second duty adjustment circuit. The first duty adjustment circuit performs first calibration operation in a first period. The second duty adjustment circuit performs second calibration operation in a second period. The first period and the second period have an overlapping period.

15 Claims, 12 Drawing Sheets

SEMICONDUCTOR APPARATUS AND METHOD FOR CONTROLLING SEMICONDUCTOR APPARATUS

CROSS-REFERENCE TO RELATED APPLICATIONS

This application is based upon and claims the benefit of priority from Japanese Patent Application No. 2019-163202, filed on Sep. 6, 2019; the entire contents of which are incorporated herein by reference.

FIELD

Embodiments described herein relate generally to a semiconductor apparatus and the method for controlling the semiconductor apparatus.

BACKGROUND

In a semiconductor apparatus configured such that multiple memory chips are connected to an external terminal via an interface chip, calibration operation of a duty adjustment circuit included on each chip is performed in some cases. In these cases, efficient execution of the calibration operation of the duty adjustment circuit of each chip is demanded.

DETAILED DESCRIPTION

Figure 1:
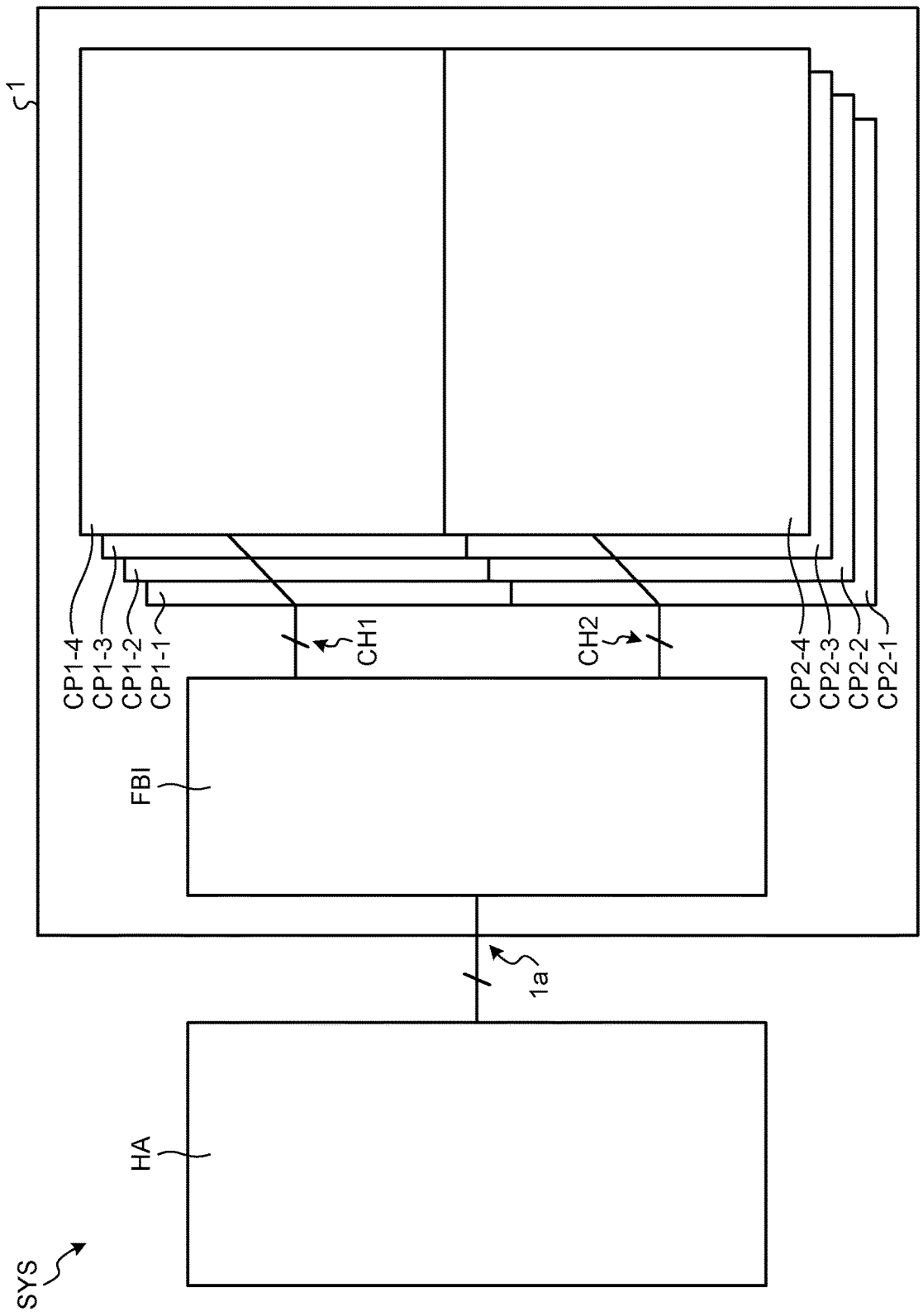
FIG. 1 is a diagram illustrating the configuration of a system to which a semiconductor apparatus according to a first embodiment is applied.

In general, according to one embodiment, there is provided a semiconductor apparatus including a first chip and a second chip. The first chip is electrically connected to a terminal to which a signal from a host device is input. The second chip is electrically connected to the first chip. The second chip has a first duty adjustment circuit. The first chip has a second duty adjustment circuit. The first duty adjustment circuit performs first calibration operation in a first period. The second duty adjustment circuit performs second calibration operation in a second period. The first period and the second period have an overlapping period.

Exemplary embodiments of a semiconductor apparatus will be explained below in detail with reference to the accompanying drawings. The present invention is not limited to the following embodiments.

First Embodiment

A semiconductor apparatus according to a first embodiment is, for example, a semiconductor memory device including multiple memory chips and an interface chip, and the multiple memory chips are connected to an external terminal via the interface chip. In the semiconductor apparatus, calibration operation of a duty adjustment circuit (DCC: Duty Cycle Corrector) included on each chip is performed in some cases. In this case, it is desired to efficiently perform the calibration operation of the DCC of each chip.

In a semiconductor apparatus (e.g., a semiconductor memory device) that performs operation in synchronization with a clock signal as in a NAND-type flash memory device, DCD (Duty Cycle Distortion: clock distortion) of the clock signal needs to be suppressed low. For this reason, the DCC is present as a circuit that corrects the caused DCD.

The DCC adjusts the duty ratio of the input clock signal to a set target duty ratio, and outputs such a signal. Such a target duty ratio is calibrated in advance to a proper duty ratio (e.g., the duty ratio=50%), and the DCC is locked with the proper target duty ratio being set. The calibration operation of inputting the clock signal for a certain period before operation to lock the DCC is called a training sequence.

In a recent semiconductor apparatus, the number of memory chips to be stacked has increased for improving a mounting density. In this case, for reducing an external load of each memory chip and realizing high-speed operation, a configuration in which an interface chip called an FBI (Frequency Boosting Interface) chip is connected to an external terminal and the interface chip and multiple memory chips are connected together via multiple channels is employed in some cases. Read DCCs are included on the interface chip and each memory chip, and a write DCC is further included on the interface chip. In this configuration, the above-described training sequence is performed for each DCC in the semiconductor apparatus. For example, when training is sequentially performed for each included memory chip in a memory system, there is a probability that training time increases and the O/H (overhead) of system operation increases as the number of stacked memory chips increases.

For these reasons, in the semiconductor apparatus, the calibration operation of the read DCC in each memory chip and the calibration operation of the read DCC in the interface chip are executed collectively. In this manner, the entire training time is shortened.

Specifically, a system SYS to which a semiconductor apparatus 1 is applied is configured as illustrated in FIG. 1. FIG. 1 is a diagram of the configuration of the system SYS to which the semiconductor apparatus 1 is applied.

The system SYS includes a host HA and the semiconductor apparatus 1. The semiconductor apparatus 1 is connectable to the host HA via a communication medium (e.g., a serial bus). The host HA may be a device such as a controller, or may be electronic equipment such as a computer or a mobile terminal. The semiconductor apparatus 1 may be configured as a multichip module including multiple memory chips. The semiconductor apparatus 1 has an interface chip FBI and multiple memory chips CP1-1 to CP1-4 and CP2-1 to CP2-4.

The semiconductor apparatus 1 may be included as a MCP (Multi Chip Package) on which the multiple memory chips CP1, CP2 are stacked. In the case of mounting the semiconductor apparatus 1 as the MCP, the periphery of the interface chip FBI and the multiple memory chips CP1-1 to CP1-4 and CP2-1 to CP2-4 may be sealed with mold resin in the semiconductor apparatus 1.

The interface chip FBI is electrically connected to among an external terminal group 1a and multiple channels CH1, CH2. The external terminal group 1a is electrically connectable to the host HA. The multiple memory chips CP1-1 to CP1-4 and CP2-1 to CP2-4 are connected to the interface chip FBI via the multiple channels CH1 and CH2. FIG. 1 illustrates, as an example, a configuration in which four memory chips CP1-1 to CP1-4 are connected to the interface chip FBI via the channel CH1 and four memory chips CP2-1 to CP2-4 are connected to the interface chip FBI via the channel CH2.

In response to a clock signal from the host HA, the semiconductor apparatus 1 performs operation in synchronization with the clock signal. The semiconductor apparatus 1 may perform data latching in synchronization with the clock signal.

Figure 2:
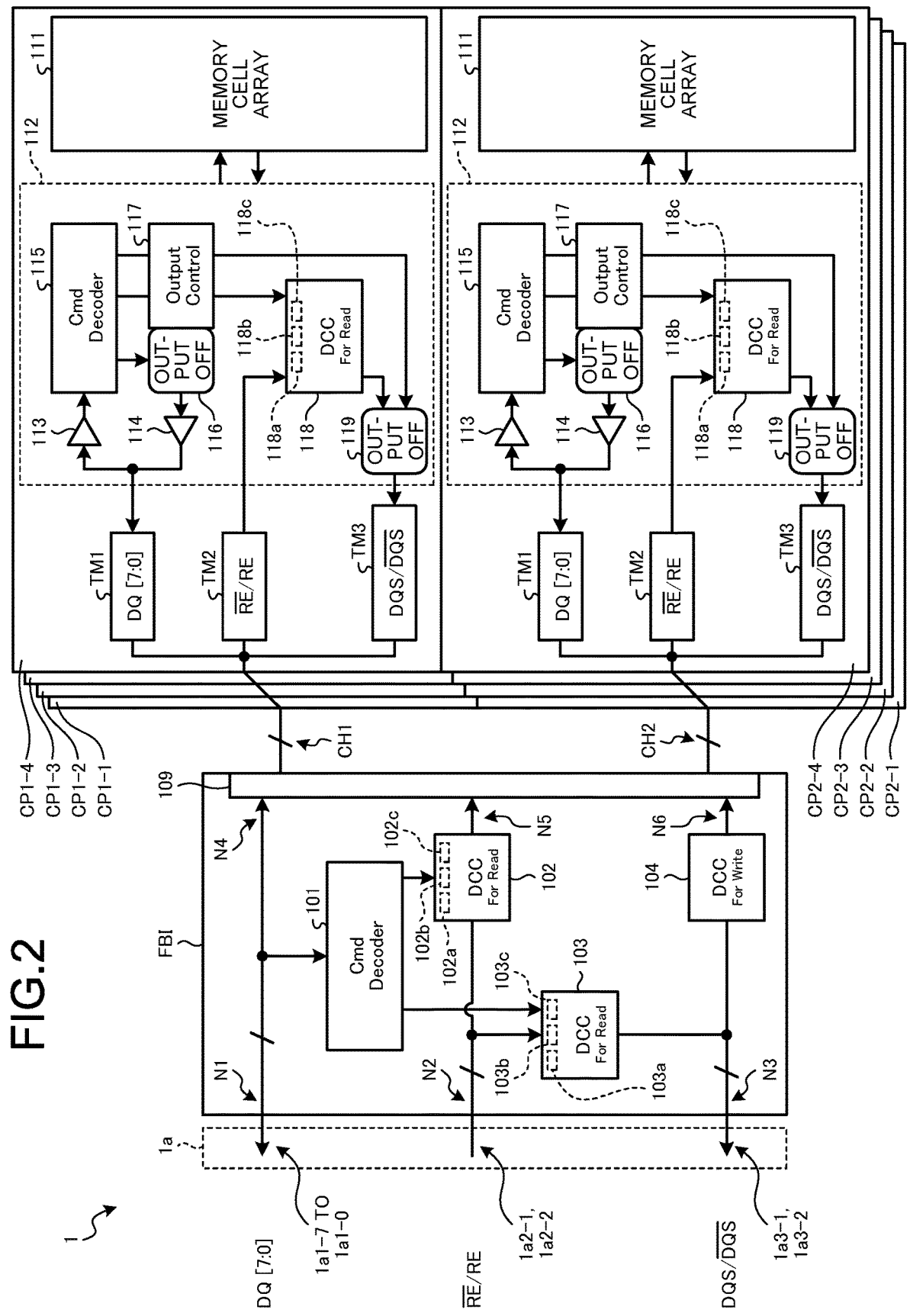
FIG. 2 is a diagram illustrating the configuration of the semiconductor apparatus according to the first embodiment.

For example, the external terminal group 1a includes, as illustrated in FIG. 2, terminals 1a1-7 to 1a1-0 for a data signal DQ[7:0], terminals 1a2-1 and 1a2-2 for a read enable signal $RE^-$/RE, and terminals 1a3-1 and 1a3-2 for a data strobe signal DQS/$DQS^-$. FIG. 2 is a diagram illustrating the configuration of the semiconductor apparatus 1.

In the training sequence for the read DCC, the read enable signal $RE^-$/RE is a clock signal supplied from the host HA. The data strobe signal DQS/$DQS^-$ is a clock signal returned to the host HA as a response.

In association with an increase in a required access speed, operation regarding a command may be performed in synchronization with double edges of the clock signal in the semiconductor apparatus 1. Thus, the clock signal may include a differential signal. A read enable signal $RE^-$ and a read enable signal RE form a pair of differential signals. A data strobe signal DQS and a data strobe signal $DQS^-$ form a pair of differential signals.

In data latching, the data duty ratio is preferably set to a proper value (e.g., the duty ratio ≈50%) for properly ensuring setup time and hold time of data. Thus, the interface chip FBI and the memory chips CP1 and CP2 each have the DCCs as the circuit for adjusting the duty of the clock signal.

The interface chip FBI has a command decoder (Cmd Decoder) 101, a read DCC (DCC For Read) 102, a read DCC (DCC For Read) 103, a write DCC (DCC For Write) 104, node groups N1 to N6, and a channel interface circuit 109.

The node group N1 is electrically connected to the terminals 1a1-7 to 1a1-0 for the data signal DQ[7:0]. The node group N1 includes nodes, the number of which corresponds to the bit width (e.g., a bit width of 8) of the data signal DQ[7:0]. The node group N1 is electrically connected to an input node of the command decoder 101 via an internal bus. The bit width of the internal bus corresponds to the bit width of the data signal DQ[7:0].

The node group N2 is electrically connected to the terminals 1a2-1 and 1a2-2 for the read enable signal $RE^-$/RE. The node group N2 includes nodes, the number of which corresponds to the bit width (e.g., two bits) of the read enable signal $RE^-$/RE. The node group N2 is electrically connected to each of an input node of the read DCC 102 and an input node of the read DCC 103 via the internal bus. The bit width of the internal bus corresponds to the bit width of the read enable signal $RE^-$/RE.

The node group N3 is electrically connected to the terminals 1a3-1 and 1a3-2 for the data strobe signal DQS/$DQS^-$. The node group N3 includes nodes, the number of which corresponds to the bit width (e.g., two bits) of the data strobe signal DQS/$DQS^-$. The node group N3 is electrically connected to each of an output node of the read DCC 103 and input and output nodes of the write DCC 104 via the internal bus. The bit width of the internal bus corresponds to the bit width of the data strobe signal DQS/$DQS^-$.

The node group N4 is electrically connected to each of the node group N1 and the input node of the command decoder 101 via the internal bus. The node group N4 includes nodes, the number of which corresponds to the bit width (e.g., a bit width of 8) of the data signal DQ[7:0]. The node group N4 may be electrically connected to at least one of the channel CH1 or the channel CH2 via the channel interface circuit 109. In the training sequence for the read DCC, the channel interface circuit 109 electrically connects the node group N4 to both of the channel CH1 and the channel CH2.

The node group N5 is electrically connected to an output node of the read DCC 102 via the internal bus. The node group N5, the node group N2 includes nodes, the number of which is corresponds to the bit width (e.g., two bits) of the read enable signal $RE^-$/RE. The node group N5 may be electrically connected to at least one of the channel CH1 or the channel CH2 via the channel interface circuit 109. In the training sequence for the read DCC, the channel interface circuit 109 electrically connects the node group N5 to both of the channel CH1 and the channel CH2.

The node group N6 is electrically connected to the input and output nodes of the write DCC 104 via the internal bus. The node group N6 includes nodes, the number of which corresponds to the bit width (e.g., two bits) of the data strobe signal DQS/$DQS^-$. The node group N6 may be electrically connected to at least one of the channel CH1 or the channel CH2 via the channel interface circuit 109. In the training sequence for the read DCC, the channel interface circuit 109 electrically connects the node group N6 to both of the channel CH1 and the channel CH2.

The read DCC 102 adjusts, with a set duty ratio, the duty ratio of the read enable signal $RE^-$/RE received via the node group N2, and supplies the adjusted read enable signal $RE^-$/RE to the node group N5. In the training sequence, such a set duty ratio is calibrated to the target duty ratio (e.g., the duty ratio=50%).

The read DCC 102 has a duty correction circuit 102a, a duty detection circuit 102b, and a correction amount determination circuit 102c. In the training sequence, feedback operation is performed by the duty correction circuit 102a, the duty detection circuit 102b, and the correction amount determination circuit 102c such that the set duty ratio approaches the target duty ratio. That is, the duty correction circuit 102a corrects the duty ratio of the read enable signal $RE^-$/RE with the set duty ratio. The duty detection circuit 102b detects the corrected duty ratio of the read enable signal $RE^-$/RE to supply the detected duty ratio to the correction amount determination circuit 102c. The correction amount determination circuit 102c determines a correction amount according to the detected duty ratio and the target duty ratio (e.g., the duty ratio=50%), and changes the set duty ratio of the duty correction circuit 102a according to the determined correction amount. The set duty ratio may be changeable at K gradations (K is an integer of equal to or greater than two, such as K=64). In a case where the detected duty ratio is lower than the target duty ratio, the correction amount determination circuit 102c increments a gradation value of the set duty ratio of the duty correction circuit 102a. In a case where the detected duty ratio is higher than the target duty ratio, the correction amount determination circuit 102c decrements the gradation value of the set duty ratio of the duty correction circuit 102a. The duty correction circuit 102a re-corrects the duty ratio of the read enable signal RE$^-$/RE with the set duty ratio. The duty detection circuit 102b detects the corrected duty ratio of the read enable signal RE$^-$/RE, and when the detected duty ratio is substantially coincident with the target duty ratio (e.g., the duty ratio=50%), fixes the correction amount to a current correction amount and brings the DCC into a lock state.

The read DCC 103 adjusts, with the set duty ratio, the duty ratio of the read enable signal RE$^-$/RE received via the node group N2, and as the data strobe signal DQS/DQS$^-$, supplies the adjusted read enable signal RE$^-$/RE to the node group N3. In the training sequence, such a set duty ratio is calibrated to the target duty ratio (e.g., the duty ratio=50%).

The read DCC 103 has a duty correction circuit 103a, a duty detection circuit 103b, and a correction amount determination circuit 103c. In the training sequence, feedback operation is performed by the duty correction circuit 103a, the duty detection circuit 103b, and the correction amount determination circuit 103c such that the set duty ratio approaches the target duty ratio. For example, the duty detection circuit 103b detects the corrected duty ratio of the read enable signal RE$^-$/RE, and when the detected duty ratio is substantially coincident with the target duty ratio (e.g., the duty ratio=50%), fixes the correction amount to a current correction amount and brings the DCC into the lock state.

Each memory chip CP1 connected to the channel CH1 has terminal groups TM1 to TM3, a memory cell array 111, and a peripheral circuit 112.

The terminal group TM1 is electrically connected to the node group N4 via the channel CH1. The terminal group TM1 includes terminals, the number of which corresponds to the bit width (e.g., a bit width of 8) of the data signal DQ[7:0]. The terminal group TM1 is electrically connected to the peripheral circuit 112.

The terminal group TM2 is electrically connected to the node group N5 via the channel CH1. The terminal group TM2 includes terminals, the number of which corresponds to the bit width (e.g., two bits) of the read enable signal RE$^-$/RE. The terminal group TM2 is electrically connected to the peripheral circuit 112.

The terminal group TM3 is electrically connected to the node group N6 via the channel CH1. The terminal group TM3 includes terminals, the number of which corresponds to the bit width (e.g., two bits) of the data strobe signal DQS/DQS$^-$. The terminal group TM3 is electrically connected to the peripheral circuit 112.

The memory cell array 111 is configured such that multiple memory cells are two-dimensionally arrayed, for example. The peripheral circuit 112 is arranged at the periphery of the memory cell array 111, and is electrically connected to among the terminal groups TM1 to TM3 and the memory cell array 111. The peripheral circuit 112 controls, according to the command received from the host HA via the interface chip FBI and the terminal group TM1, access operation (e.g., read operation, write operation) to each memory cell in the memory cell array 111.

The peripheral circuit 112 has a receiver 113, a driver 114, a command decoder (Cmd Decorder) 115, an output cutoff (OUTPUT OFF) circuit 116, an output control (Output Control) circuit 117, a read DCC (DCC For Read) 118, and an output cutoff (OUTPUT OFF) circuit 119.

Of the receiver 113, an input node is electrically connected to the terminal group TM1, and an output node is electrically connected to the command decoder 115. Of the driver 114, an input node is electrically connected to the output cutoff circuit 116, and an output node is electrically connected to the terminal group TM1. Of the command decoder 115, an input node is electrically connected to the receiver 113, and an output node is electrically connected to each of the output cutoff circuit 116 and the output control circuit 117. Of the output cutoff circuit 116, an input node is electrically connected to the command decoder, and an output node is electrically connected to the driver 114. Of the output control circuit 117, an input node is electrically connected to the command decoder 115, and an output node is electrically connected to each of the read DCC 118 and the output cutoff circuit 119. Of the read DCC 118, an input node is electrically connected to the terminal group TM2 and the output control circuit 117, and an output node is electrically connected to the output cutoff circuit 119. Of the output cutoff circuit 119, an input node is electrically connected to each of the read DCC 118 and the output control circuit 117, and an output node is electrically connected to the terminal group TM3.

The read DCC 118 adjusts, with the set duty ratio, the duty ratio of the read enable signal RE$^-$/RE received via the terminal group TM2, and supplies the adjusted read enable signal RE$^-$/RE to the output cutoff circuit 119. In the training sequence, such a set duty ratio is calibrated to the target duty ratio (e.g., the duty ratio=50%).

The read DCC 118 has a duty correction circuit 118a, a duty detection circuit 118b, and a correction amount determination circuit 118c. In the training sequence, feedback operation is performed by the duty correction circuit 118a, the duty detection circuit 118b, and the correction amount determination circuit 118c such that the set duty ratio approaches the target duty ratio. For example, the duty detection circuit 118b detects the corrected duty ratio of the read enable signal RE$^-$/RE, and when the detected duty ratio is substantially coincident with the target duty ratio (e.g., the duty ratio=50%), fixes the correction amount to a current correction amount and brings the DCC into the lock state.

The output cutoff circuit 116 is arranged between the command decoder 115 and the driver 114. The output cutoff circuit 116 receives a command decode result from the command decoder 115. For example, according to whether or not the command is a calibration command for instructing a collective execution mode of the calibration operation of the read DCC, the output cutoff circuit 116 cuts off a power supply to the driver 114 to stop the output of the data signal DQ[7:0] from the driver 114 to the terminal group TM1. That is, the output cutoff circuit 116 deactivates the terminal group TM1.

Note that when cutoff of the power supply by the output cutoff circuit 116 is canceled and the power supply is resumed in association with completion of execution of the calibration command, the driver 114 is brought into a state in which the data signal DQ[7:0] which needs to be output may be output to the terminal group TM1.

The output control circuit 117 is arranged among the command decoder 115, the read DCC 118, and the output cutoff circuit 119. The output control circuit 117 receives the command decode result from the command decoder 115. For example, according to whether or not the command is the calibration command for instructing the collective execution mode of the calibration operation of the read DCC, the output cutoff circuit 116 instructs the read DCC 118 to start the calibration operation, and instructs the output cutoff circuit 119 to stop the output of the data strobe signal DQS/DQS⁻.

The output cutoff circuit 119 is arranged between the output control circuit 117 and the terminal group TM3. In response to the adjusted read enable signal RE⁻/RE from the read DCC 118, the output cutoff circuit 119 may output, as the data strobe signal DQS/DQS⁻, the adjusted read enable signal RE⁻/RE to the terminal group TM3. When receiving the instruction for stopping the output of the data strobe signal DQS/DQS⁻ from the output control circuit 117, the output cutoff circuit 119 stops the output of the data strobe signal DQS/DQS⁻ to the terminal group TM3 according to such an instruction. That is, the output cutoff circuit 119 deactivates the terminal group TM3.

Note that when the output stop instruction from the output control circuit 117 is canceled in association with completion of execution of the calibration command, the output cutoff circuit 119 is brought into a state in which the adjusted read enable signal RE⁻/RE may be, as the data strobe signal DQS/DQS⁻, output to the terminal group TM3.

Each memory chip CP2 connected to the channel CH2 has terminal groups TM1 to TM3, a memory cell array 111, and a peripheral circuit 112. The terminal groups TM1 to TM3, the memory cell array 111, and the peripheral circuit 112 are each similar to the terminal groups TM1 to TM3, the memory cell array 111, and the peripheral circuit 112 in the memory chip CP1.

Figure 3:
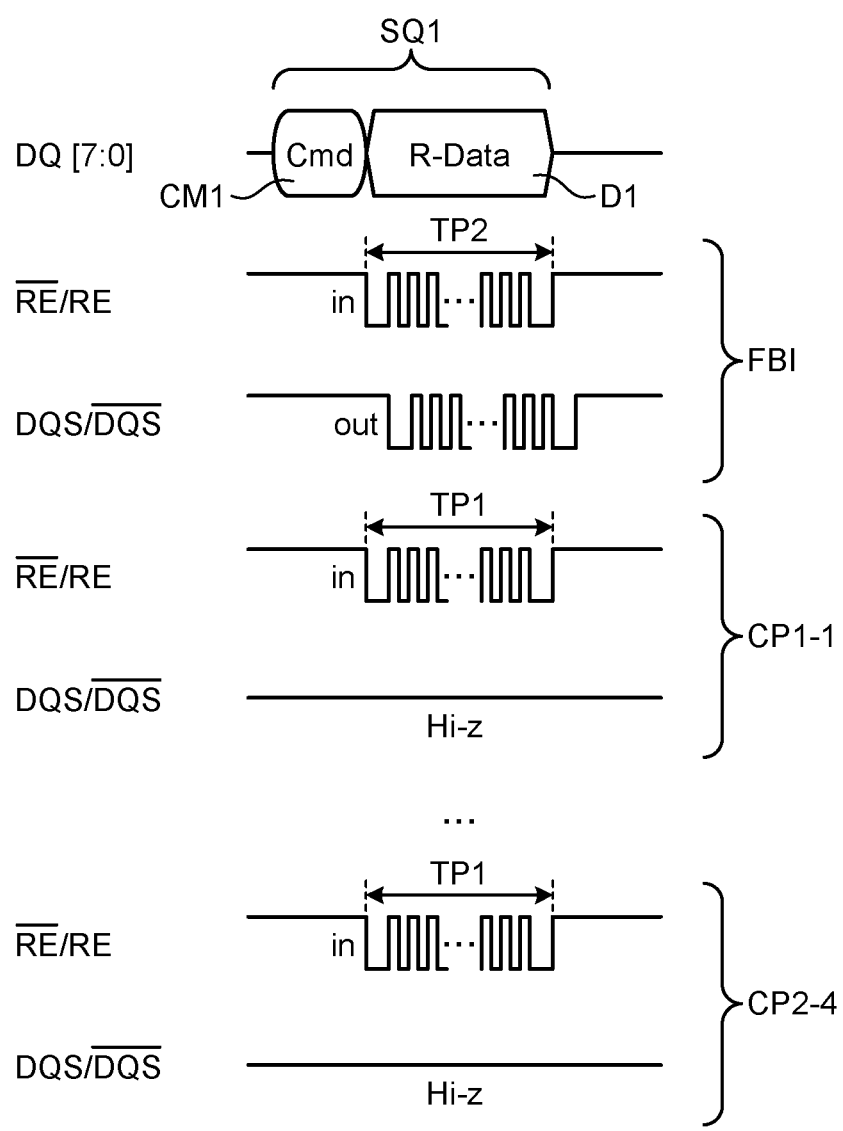
FIG. 3 is a waveform chart illustrating operation of the semiconductor apparatus according to the first embodiment.

In a training sequence SQ1 for the read DCC, the semiconductor apparatus 1 performs operation as illustrated in FIG. 3, for example. FIG. 3 is a waveform chart illustrating operation of the semiconductor apparatus 1.

In the case of receiving a calibration command CM1 for instructing the calibration operation of the read DCC from the host HA, the interface chip FBI supplies the calibration command CM1 to the command decoder 101, and supplies the calibration command CM1 to the memory chips CP1-1 to CP1-4 by way of the channel CH1 and supplies the calibration command CM1 to the memory chips CP2-1 to CP2-4 by way of the channel CH2.

In the interface chip FBI, the command decoder 101 decodes the calibration command CM1. According to the calibration command CM1, the command decoder 101 interprets that the calibration operation of the read DCC in the collective execution mode has been instructed, and instructs the read DCC 102 and the read DCC 103 to start the calibration operation of the DCC.

Each of the read DCC 102 and the read DCC 103 performs the calibration operation in a period TP2. When receiving the read enable signal RE⁻/RE (the read clock signal) from the host HA by way of the terminals 1a2-1 and 1a2-2 at the timing of starting the period TP2, each of the read DCC 102 and the read DCC 103 uses the read enable signal RE⁻/RE to start the feedback operation for causing the set duty ratio to approach the target duty ratio.

Moreover, the interface chip FBI broadcast-transmits the read enable signal RE⁻/RE adjusted by the read DCC 102 to the terminal groups TM2 of the multiple memory chips CP1-1 to CP1-4 by way of the channel interface circuit 109 and the channel CH1. In addition, the interface chip FBI broadcast-transmits the read enable signal RE⁻/RE adjusted by the read DCC 102 to the terminal groups TM2 of the multiple memory chips CP2-1 to CP2-4 by way of the channel interface circuit 109 and the channel CH2.

At this point, it may be configured such that for the read enable signal RE⁻/RE supplied to the memory chips CP1-1 to CP1-4 and CP2-1 to CP2-4, gating (stop) of the output of RE⁻/RE to each memory chip is performed until the read DCC 102 of the interface chip FBI is locked and the read enable signal RE⁻/RE is supplied to each memory chip after the DCC 102 has been locked.

In each of the memory chips CP1 and CP2 sharing the channels CH1 and CH2, the command decoder 115 decodes the calibration command CM1. The command decoder 115 interprets, according to the calibration command CM1, that the calibration operation of the read DCC in the collective execution mode has been instructed, and by way of the output control circuit 117, instructs the read DCC 118 to start the calibration operation of the DCC. The read DCC 118 is brought into a state in which the calibration operation of the DCC may be started.

Accordingly, the read DCC 118 in each of the memory chips CP1-1 to CP1-4 connected to the channel CH1 performs the calibration operation in a period TP1. When receiving the read enable signal RE⁻/RE (the read clock signal) illustrated in FIG. 3 at the timing of starting the period TP1, each of the read DCCs 118 of the memory chips CP1-1 to CP1-4 uses the read enable signal RE⁻/RE to start the feedback operation for causing the set duty ratio to approach the target duty ratio. Moreover, the read DCC 118 in each of the memory chips CP2-1 to CP2-4 connected to the channel CH2 performs the calibration operation in the period TP1. When receiving the read enable signal RE⁻/RE (the read clock signal) illustrated in FIG. 3 at the timing of starting the period TP1, each of the read DCCs 118 of the memory chips CP2-1 to CP2-4 uses the read enable signal RE⁻/RE to start the feedback operation for causing the set duty ratio to approach the target duty ratio.

At this point, any of the terminal groups TM1 of the memory chips CP1-1 to CP1-4 and CP2-1 to CP2-4 is in a high-impedance state. Thus, according to a high-impedance signal received from the terminal group TM1 of each of the memory chips CP1-1 to CP1-4 and CP2-1 to CP2-4 by way of the channel interface circuit 109, the interface chip FBI returns, as the data signal DQ[7:0], dummy data D1 (e.g., all "0") to the host HA by way of the node group N1 and the terminals 1a1-7 and 1a1-0. The size of the data D1 is determined in advance such that a transfer period of the data D1 has a size corresponding to a sufficient period for completing the calibration operation by the DCCs of the interface chip FBI and each memory chip.

Moreover, any of the terminal groups TM3 of the memory chips CP1-1 to CP1-4 and CP2-1 to CP2-4 is in a high-impedance state. Thus, according to a high-impedance signal received from the terminal group TM3 of each of the memory chips CP1-1 to CP1-4 and CP2-1 to CP2-4 by way of the channel interface circuit 109, the interface chip FBI generates the data strobe signal DQS/DQS⁻ as a substitute. For example, the interface chip FBI returns, as the data strobe signal DQS/DQS⁻ illustrated in FIG. 3, the read enable signal RE⁻/RE adjusted by the read DCC 103 to the host HA by way of the node group N3 and the terminals 1a3-1 and 1a3-2.

In this case, when being transferred simultaneously, the data signals DQ and the data strobe signals DQS/DQS⁻ of the memory chips CP1-1 to CP1-4 sharing the channel CH1 might short-circuit on the channel CH1. When being transferred simultaneously, the data signals DQ and the data strobe signals DQS/DQS⁻ of the memory chips CP2-1 to CP2-4 sharing the channel CH2 might short-circuit on the channel CH2. Tendency shows that the DCC training time increases when DCC training is performed for the multiple chips (the interface chip FBI, the memory chips CP1 and CP2) one by one such that the short-circuit of the signals on the channels CH1 and CH2 is avoided.

On the other hand, in the training sequence SQ1 illustrated in FIG. 3, the read enable signal RE⁻/RE is received by each of the memory chips CP1 and CP2 sharing the channels CH1 and CH2 after reception of the calibration command CM1. In each of the memory chips CP1 and CP2, the DCC 118 receives, by control of the output control circuit 117, the read enable signal RE⁻/RE to start the calibration operation of the DCC. Moreover, in each of the memory chips CP1 and CP2, the terminal groups TM1 and TM3 are brought into a high-impedance state by the output cutoff circuits 116 and 119. That is, after reception of the command CM1 for instructing the calibration operation of the DCC, control is made such that the output of the data signal DQ and the data strobe signal DQS/DQS⁻ from each of the memory chips CP1 and CP2 to the interface chip FBI is stopped and the output of a dummy data signal DQ and a dummy data strobe signal DQS/DQS⁻ is returned from the interface chip FBI to a host HA side. Accordingly, the semiconductor apparatus 1 may make such control that the period TP1 in which DCC training of the read DCCs 102 and 103 in the interface chip FBI is performed and the period TP2 in which DCC training of the read DCC 118 in each of the memory chips CP1 and CP2 is performed have an overlapping period. Thus, training of the read DCC may be collectively executed for all chips, and therefore, DCC training execution time may be considerably shortened.

As described above, in the first embodiment, the calibration operation of the read DCC 118 in each of the memory chips CP1 and CP2 and the calibration operation of the read DCCs 102 and 103 in the interface chip FBI are collectively executed in the semiconductor apparatus 1. For example, the period TP1 in which the calibration operation of the DCCs 102 and 103 is performed in the interface chip FBI and the period TP2 in which the calibration operation of the read DCC 118 in each of the memory chips CP1 and CP2 is performed have the overlapping period. With this operation, in the semiconductor apparatus 1, the calibration operation of the DCC of each chip may be efficiently performed, and the entire training time may be shortened.

Note that the calibration command CM1 which needs to be received by the interface chip FBI and each of the memory chips CP1 and CP2 may be prepared as a command dedicated to instruction of the configuration operation of the read DCC.

Alternatively, the calibration command CM1 may be the same as a training command upon individual execution. In this case, a register that switches between the collective execution mode and an individual execution mode may be set in advance by a set feature command. In this case, the register that switches between the collective execution mode and the individual execution mode may be provided in the command decoders 101 and 115 in the interface chip FBI and each of the memory chips CP1 and CP2.

Moreover, in the training sequence SQ1 of the read DCC, the data strobe signal DQS/DQS⁻ may be output from a single memory chip selected from the memory chips CP1 and CP2 to the interface chip FBI. In such configuration, the interface chip FBI returns the data strobe signal DQS/DQS⁻ to the host HA by way of the read DCC 103.

Second Embodiment

Next, a semiconductor apparatus 1 according to a second embodiment will be described. Hereinafter, differences from the first embodiment will be mainly described.

The first embodiment has described the control method in which the calibration of the read DCC is collectively executed for all chips. However, the load current of the entirety of the system is high, and for this reason, there is a probability that the DCC is locked in an unstable state such as fluctuation in power supply voltage due to the load current.

For this reason, in the second embodiment, chips for which training is to be simultaneously performed may be selected, and calibration operation of a read DCC is simultaneously executed (collectively executed) for every predetermined number of chips (e.g., every four chips of eight memory chips) among all memory chips. Selection of the chips targeted for simultaneous execution is performed by setting according to command input before execution of training. For example, the semiconductor apparatus 1 separately executes the calibration operation of the read DCC of each chip (an interface chip FBI and each of memory chips CP1 and CP2) in multiple training sequences. That is, the semiconductor apparatus 1 sequentially receives, from a host HA, multiple calibration commands for instructing the calibration operation of the read DCC in a separate execution mode, and sequentially performs the multiple training sequences according to the multiple calibration commands.

Figure 4:
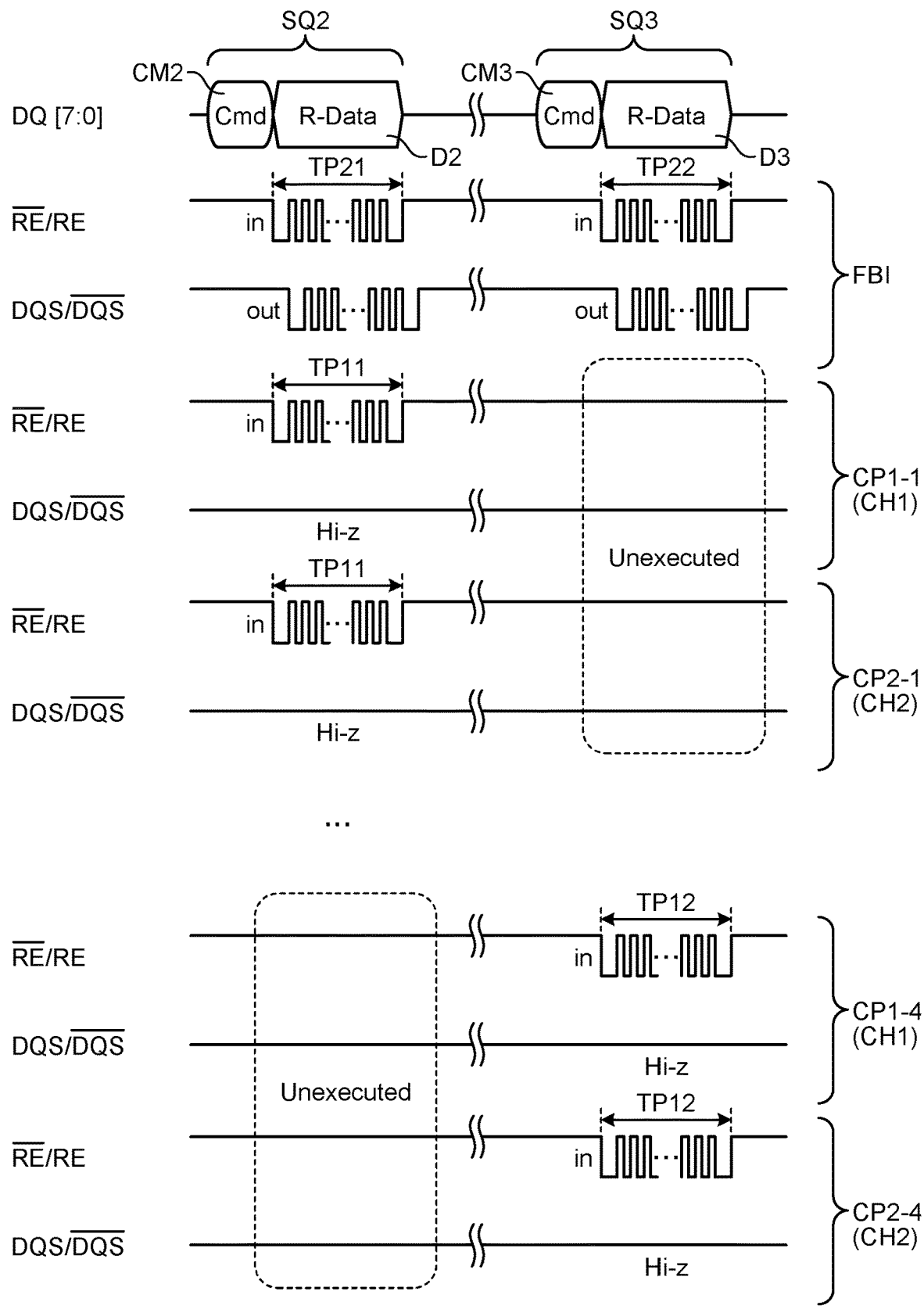
FIG. 4 is a waveform chart illustrating operation of a semiconductor apparatus according to a second embodiment.

Specifically, in the training sequence of the read DCC, the semiconductor apparatus 1 performs operation different from that of the first embodiment on the following points, as illustrated in FIG. 4. FIG. 4 is a waveform chart illustrating operation of the semiconductor apparatus 1.

For example, a calibration command CM2 may be determined in advance as a command for instructing calibration operation of read DCCs of a first chip group in the separate execution mode, and a calibration command CM3 may be determined in advance as a command for instructing calibration operation of read DCCs of a second chip group in the separate execution mode. The first chip group includes the interface chip FBI and odd-numbered memory chips CP1-1, CP1-3, CP2-1, and CP2-3 connected to each of channels CH1 and CH2. The second chip group includes the interface chip FBI and even-numbered memory chips CP1-2, CP1-4, CP2-2, and CP2-4 connected to each of the channels CH1 and CH2.

In a training sequence SQ2, the interface chip FBI supplies, in the case of receiving the calibration command CM2 from the host HA, the calibration command CM2 to a command decoder 101, and supplies the calibration command CM2 to the memory chips CP1-1 to CP1-4 by way of the channel CH1 and supplies the calibration command CM2 to the memory chips CP2-1 to CP2-4 by way of the channel CH2.

The command decoder 101 of the interface chip FBI decodes the calibration command CM2. According to the calibration command CM2, the command decoder 101 interprets that the calibration operation of the read DCCs of the first chip group in the separate execution mode has been instructed, and instructs a read DCC 102 and a read DCC 103 to start the calibration operation of the DCC. The read DCC 102 and the read DCC 103 of the interface chip FBI each perform the calibration operation in a period TP21 and a period TP22.

In each of the memory chips CP1-1 to CP1-4 and CP2-1 to CP2-4 sharing the channels CH1 and CH2, the command decoder 115 decodes the calibration command CM2.

In each of the odd-numbered memory chips CP1-1, CP1-3, CP2-1, and CP2-3, the command decoder 115 interprets, according to the calibration command CM2, that the calibration operation of the read DCC in the separate execution mode has been instructed, and by way of an output control circuit 117, instructs a read DCC 118 to start the calibration operation of the DCC. The read DCCs 118 of the odd-numbered memory chips CP1-1, CP1-3, CP2-1, and CP2-3 perform the calibration operation in a period TP11. The read DCC 118 of each of the odd-numbered memory chips CP1-1, CP1-3, CP2-1, and CP2-3 is, at the timing of starting the period TP11, brought into a state in which the calibration operation of the DCC may be started. When receiving a read enable signal RE$^-$/RE (a read clock signal) illustrated in FIG. 4, the read DCC 118 uses the read enable signal RE$^-$/RE to start feedback operation for causing a set duty ratio to approach a target duty ratio. At this point, terminal groups TM1 and TM3 are brought into a high-impedance state by output cutoff circuits 116 and 119. That is, the output cutoff circuits 116 and 119 deactivate the terminal groups TM1 and TM3.

In each of the even-numbered memory chips CP1-2, CP1-4, CP2-2, and CP2-4, the command decoder 115 interprets, according to the calibration command CM2, that the calibration operation of the read DCC in the separate execution mode is not instructed, and does not instruct the read DCC 118 to start the calibration operation of the DCC. The read DCC 118 does not perform the calibration operation. That is, the read DCC 118 does not receive the read enable signal RE$^-$/RE (the read clock signal) as indicated by "Unexecuted" in FIG. 4, and does not start the feedback operation for causing the set duty ratio to approach the target duty ratio.

The interface chip FBI returns, as a data signal DQ[7:0], dummy data D2 (e.g., all "0") to the host HA by way of a node group N1 and terminals 1a1-7 and 1a1-0. The interface chip FBI returns, as a data strobe signal DQS/DQS$^-$ illustrated in FIG. 4, the read enable signal RE$^-$/RE adjusted by the read DCC 103 to the host HA by way of a node group N3 and terminals 1a3-1 and 1a3-2.

In a training sequence SQ3, operation similar to that of the training sequence SQ2 is performed, except that operation of the odd-numbered memory chips CP1-1, CP1-3, CP2-1, and CP2-3 and operation of the even-numbered memory chips CP1-2, CP1-4, CP2-2, and CP2-4 are replaced with each other and the period TP11 is replaced with a period TP12.

Note that the period TP11 in which DCC training is performed by the read DCCs 118 of the odd-numbered memory chips CP1-1, CP1-3, CP2-1, and CP2-3 and the period TP12 in which DCC training is performed by the read DCCs 118 of the even-numbered memory chips CP1-2, CP1-4, CP2-2, and CP2-4 do not overlap with each other.

Moreover, the period TP11 in which DCC training is performed by the read DCCs 118 of the odd-numbered memory chips CP1-1, CP1-3, CP2-1, and CP2-3 has a period overlapping with the period TP21 in which DCC training is performed by the read DCC 102 and the read DCC 103 of the interface chip FBI, but does not overlap with the period TP22 in which DCC training is performed by the read DCC 102 and the read DCC 103 of the interface chip FBI.

Further, the period TP12 in which DCC training is performed by the read DCCs 118 of the even-numbered memory chips CP1-2, CP1-4, CP2-2, and CP2-4 has a period overlapping with the period TP22 in which DCC training is performed by the read DCC 102 and the read DCC 103 of the interface chip FBI, but does not overlap with the period TP21 in which DCC training is performed by the read DCC 102 and the read DCC 103 of the interface chip FBI.

One of two periods TP21 and TP22 in which DCC training is performed by the read DCC 102 and the read DCC 103 of the interface chip FBI may be omitted.

As described above, in the second embodiment, the number of memory chips for which DCC training is simultaneously executed (collectively executed) may be selected in the semiconductor apparatus 1. For example, the command decoder of each chip may interpret the command for calibration in the separate execution mode, and it may be interpreted whether or not the chip itself needs to execute DCC training. For example, the period TP11 in which DCC training is performed by the read DCCs 118 of the odd-numbered memory chips and the period TP12 in which DCC training is performed by the read DCCs 118 of the even-numbered memory chips do not overlap with each other. Thus, the chips targeted for simultaneous execution may be selected as necessary, and therefore, stable locking of the DCC of each chip, such as suppression of fluctuation in power supply voltage, as compared to collective execution for all chips may be realized.

The calibration commands CM2 and CM3 may be the same as training command numbers in individual execution. In this case, a register that switches between a collective execution mode and an individual execution mode and the chip group to be validated in the collective execution mode may be set in advance by a set feature command.

Third Embodiment

Next, a semiconductor apparatus 1$i$ according to a third embodiment will be described. Hereinafter, differences from the first embodiment and the second embodiment will be mainly described.

In the first embodiment, the control of collectively executing the read DCCs for all chips has been described as an example. However, the write DCC included on the interface chip FBI needs to be separately executed.

In the third embodiment, a command dedicated to DCC training allowing simultaneous input of a read enable signal RE$^-$/RE and a data strobe signal DQS/DQS$^-$ from a host HA to an interface chip FBI is provided. Further, a circuit that stops the output of the data strobe signal DQS/DQS$^-$ to the host HA upon reception of the dedicated command and a circuit that stops the output of the data strobe signal DQS/DQS$^-$ to each of memory chips CP1 and CP2 are added to the interface chip FBI. With this configuration, calibration operation of read DCCs 102 and 103 and a write DCC 104 for the interface chip FBI may be collectively executed. At this point, as in the first embodiment, calibration operation of a read DCC 118 of each of the memory chips CP1 and CP2 may be also collectively executed.

Figure 5:
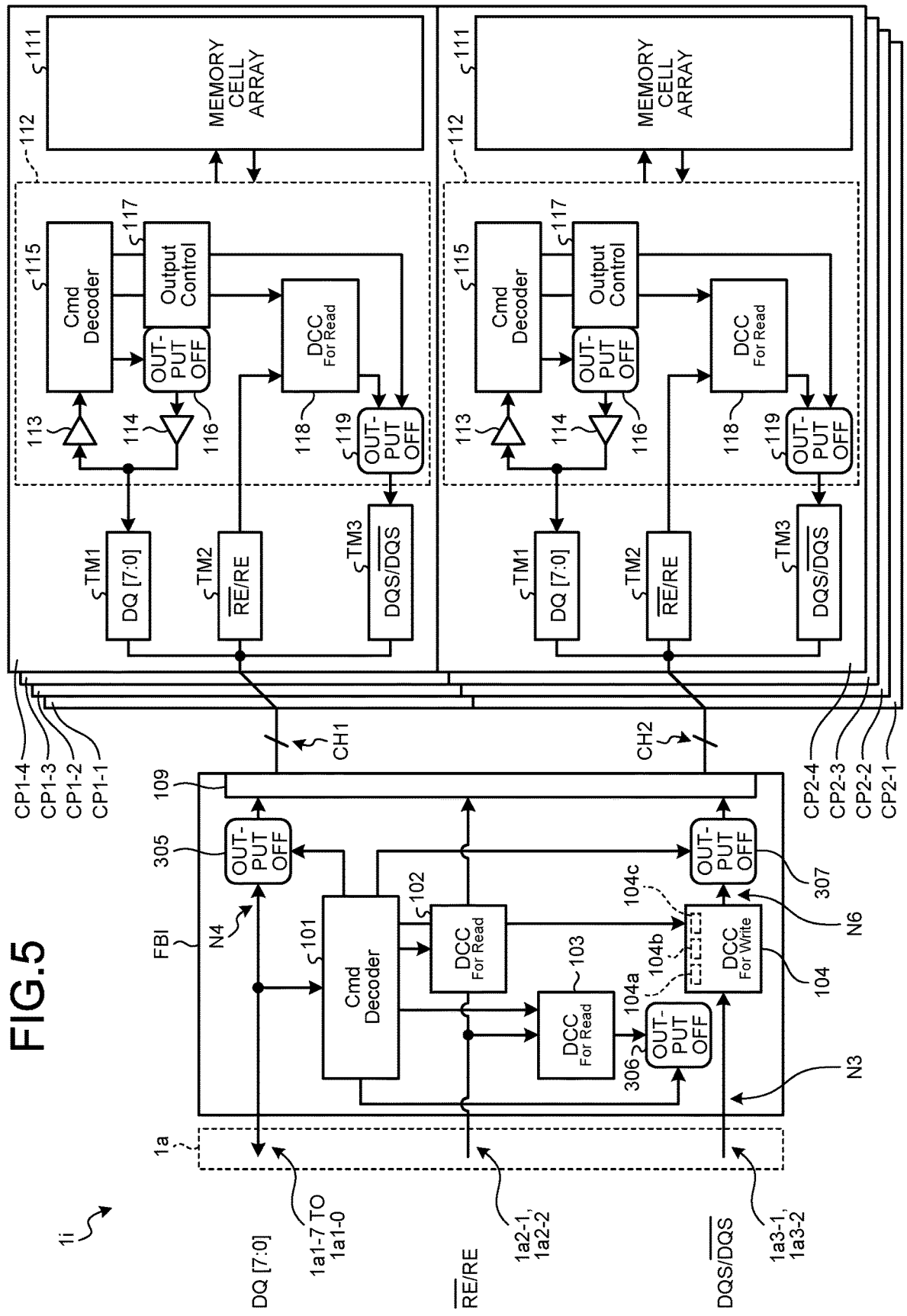
FIG. 5 is a diagram illustrating the configuration of a semiconductor apparatus according to a third embodiment.

Specifically, as illustrated in FIG. 5, in the semiconductor apparatus 1$i$, the interface chip FBI further has an output cutoff (OUTPUT OFF) circuit 305, an output cutoff (OUTPUT OFF) circuit 306, and an output cutoff (OUTPUT OFF) circuit 307. FIG. 5 is a diagram illustrating the configuration of the semiconductor apparatus 1$i$.

The output cutoff circuit 305 is arranged between a node group N4 and a channel interface circuit 109. The output cutoff circuit 305 receives a command decode result from a command decoder 101. According to whether or not the command is a calibration command for instructing a collective execution mode of the calibration operation of the read/write DCC, the output cutoff circuit 305 transfers the calibration command to each of the memory chips CP1 and CP2, and transfer of write data D4 subsequently received from the host HA to each of the memory chips CP1 and CP2 is cut off. That is, the output cutoff circuit 305 electrically cuts off the channel interface circuit 109 from terminals 1a1-7 to 1a1-0.

The output cutoff circuit 306 is arranged between the read DCC 103 and a node group N3. The output cutoff circuit 306 receives the command decode result from the command decoder 101. For example, according to whether or not the command is the calibration command for instructing the collective execution mode of the calibration operation of the read/write DCC, the output cutoff circuit 306 stops the output of the data strobe signal DQS/DQS⁻ from the read DCC 103 to the node group N3.

The write DCC 104 adjusts, with a set duty ratio, the duty ratio of the data strobe signal DQS/DQS⁻ received via the node group N3, and supplies the adjusted data strobe signal DQS/DQS⁻ to a node group N6. In a training sequence, such a set duty ratio is calibrated to a target duty ratio (e.g., the duty ratio=50%).

The write DCC 104 has a duty correction circuit 104a, a duty detection circuit 104b, and a correction amount determination circuit 104c. In the training sequence, feedback operation is performed by the duty correction circuit 104a, the duty detection circuit 104b, and the correction amount determination circuit 104c such that the set duty ratio approaches the target duty ratio. For example, the duty detection circuit 104b detects the corrected duty ratio of the data strobe signal DQS/DQS⁻, and when the detected duty ratio is subsequently coincident with the target duty ratio (e.g., the duty ratio=50%), fixes a correction amount to a current correction amount and brings the DCC into a lock state.

The output cutoff circuit 307 is arranged between the node group N6 and the channel interface circuit 109. The output cutoff circuit 307 receives the command decode result from the command decoder 101. For example, according to whether or not the command is the calibration command for instructing the collective execution mode of the calibration operation of the read/write DCC, the output cutoff circuit 307 stops the output of the data strobe signal DQS/DQS⁻ from the write DCC 104 to each of the memory chips CP1 and CP2. That is, the output cutoff circuit 307 electrically cuts off the channel interface circuit 109 from the write DCC 104.

Figure 6:
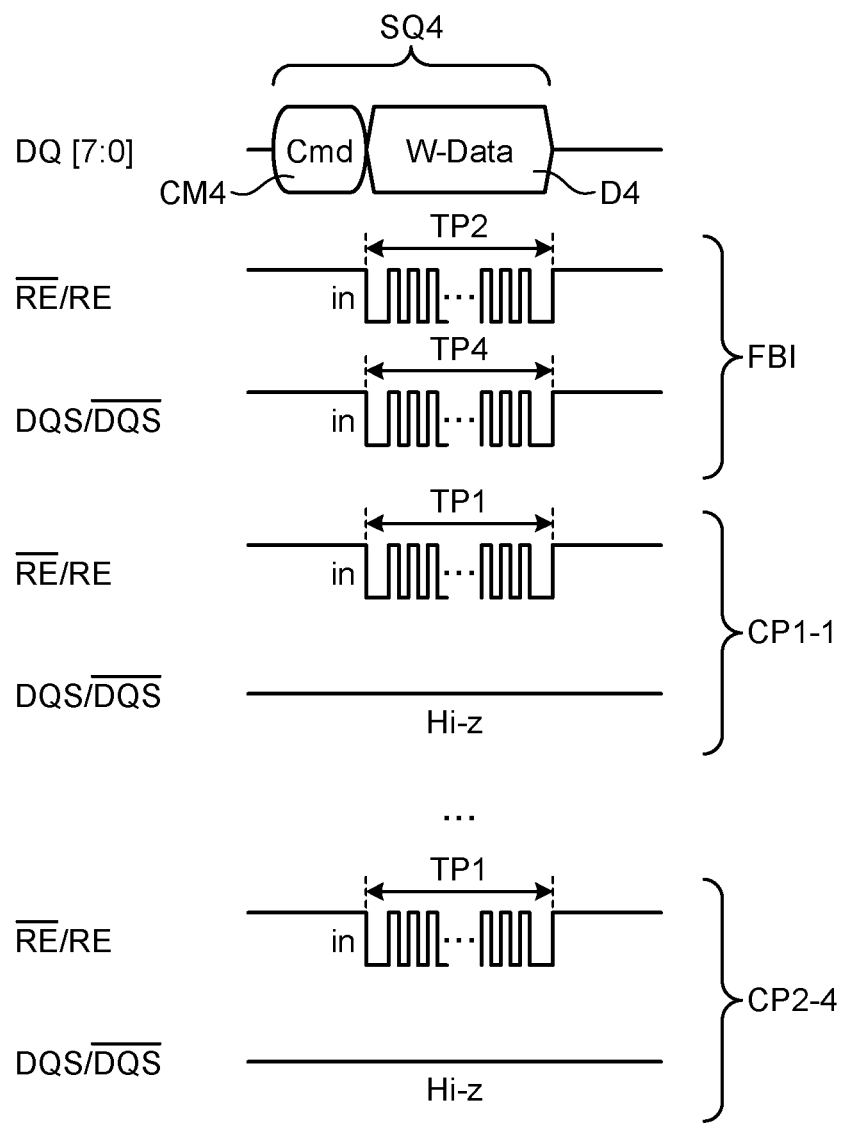
FIG. 6 is a waveform chart illustrating operation of the semiconductor apparatus according to the third embodiment.

Moreover, in a training sequence SQ4 for the read/write DCC, the semiconductor apparatus 1i performs operation different from that of the first embodiment on the following points, as illustrated in FIG. 6. FIG. 6 is a waveform chart illustrating operation of the semiconductor apparatus 1i.

In the interface chip FBI, the command decoder 101 decodes a calibration command CM4. According to the calibration command CM4, the command decoder 101 interprets that the calibration operation of the read/write DCC in the collective execution mode has been instructed, and instructs the read DCC 102, the read DCC 103, and the write DCC 104 to start the calibration operation of the DCC.

Each of the read DCC 102 and the read DCC 103 performs the calibration operation in a period TP2. When receiving the read enable signal RE⁻/RE (a read clock signal) from the host HA by way of terminals 1a2-1 and 1a2-2 at the timing of starting the period TP2, each of the read DCC 102 and the read DCC 103 uses the read enable signal RE⁻/RE to start the feedback operation for causing the set duty ratio to approach the target duty ratio. The write DCC 104 performs the calibration operation in a period TP4. When receiving the data strobe signal DQS/DQS⁻ (a write clock signal) from the host HA by way of terminals 1a3-1 and 1a3-2 at the timing of starting the period TP4, the write DCC 104 uses the data strobe signal DQS/DQS⁻ to start the feedback operation for causing the set duty ratio to approach the target duty ratio.

At this point, in response to the command decode result from the command decoder 101, the output cutoff circuit 305 transfers the calibration command to each of the memory chips CP1 and CP2, and cuts off transfer of the write data D4 subsequently received from the host HA to each of the memory chips CP1 and CP2. Moreover, in response to the command decode result from the command decoder 101, the output cutoff circuit 306 stops the output of the data strobe signal DQS/DQS⁻ from the read DCC 103 to the node group N3. In response to the command decode result from the command decoder 101, the output cutoff circuit 307 stops the output of the data strobe signal DQS/DQS⁻ from the write DCC 104 to each of the memory chips CP1 and CP2.

With this operation, the calibration operation of the read DCCs of the interface chip FBI and each of the memory chips CP1 and CP2 and the calibration operation of the write DCC of the interface chip FBI may be simultaneously executed. The semiconductor apparatus 1 may make such control that a period TP1 in which DCC training of the read DCCs 102 and 103 in the interface chip FBI is performed, the period TP2 in which DCC training of the read DCC 118 in each of the memory chips CP1 and CP2 is performed, and the period TP4 in which training of the write DCC 104 in the interface chip FBI is performed have an overlapping period. As a result, the entire DCC training time may be further shortened as compared to the first embodiment.

As described above, in the third embodiment, the calibration operation of the read DCCs of the interface chip FBI, the calibration operation of the read DCC of each of the memory chips CP1 and CP2, and the calibration operation of the write DCC of the interface chip FBI are collectively executed in the semiconductor apparatus 1i. For example, the period TP1 in which the calibration operation of the DCCs 102 and 103 in the interface chip FBI is performed, the period TP2 in which the calibration operation of the read DCC 118 in each of the memory chips CP1 and CP2 is performed, and the period TP4 in which the calibration operation of the write DCC 104 in the interface chip FBI is performed have the overlapping period. With this operation, in the semiconductor apparatus 1i, the calibration of the DCC of each chip may be more efficiently performed, and the entire training time may be further shortened.

The calibration command CM4 may be the same as a training command number upon individual execution. In this case, a register that switches between the collective execution mode and an individual execution mode and the chip group to be validated in the collective execution mode may be set in advance by a set feature command.

Fourth Embodiment

Next, a semiconductor apparatus 1j according to a fourth embodiment will be described. Hereinafter, differences from the first to third embodiments will be mainly described.

In the first to third embodiments, the technique of realizing shortening of the training time for the multiple chips has been devised. In the fourth embodiment, the technique of realizing shortening of training time for a single chip is devised.

In the first to third embodiments, the length of the period in which the interface chip FBI returns the dummy data D1 to D4 (see FIGS. 3, 4, and 6) to the host HA is determined in advance as the sufficient time (e.g., a data transfer time of 16 KB (a size corresponding to one page)) for locking the DCC performing the calibration operation. That is, there is a probability that the length of the period of the data D1 to D4 is considerably longer than a time length until the DCC is actually locked. Moreover, for confirming that the DCC is actually locked, the host HA issues a status read command to the semiconductor apparatus, and makes such confirmation by receiving a response to such a command from the semiconductor apparatus. There is a probability that the time of such a training+confirmation sequence is much more considerably longer than the time length until the DCC is actually locked.

For this reason, in the fourth embodiment, each chip converts status information indicating the progress of calibration operation of a DCC into a passcode identifiable in a host HA, and returns dummy data D1 to D4 to the host HA with part of the dummy data D1 to D4 being replaced with the passcode. In this manner, the time of a training+confirmation sequence is shortened.

Figure 7:
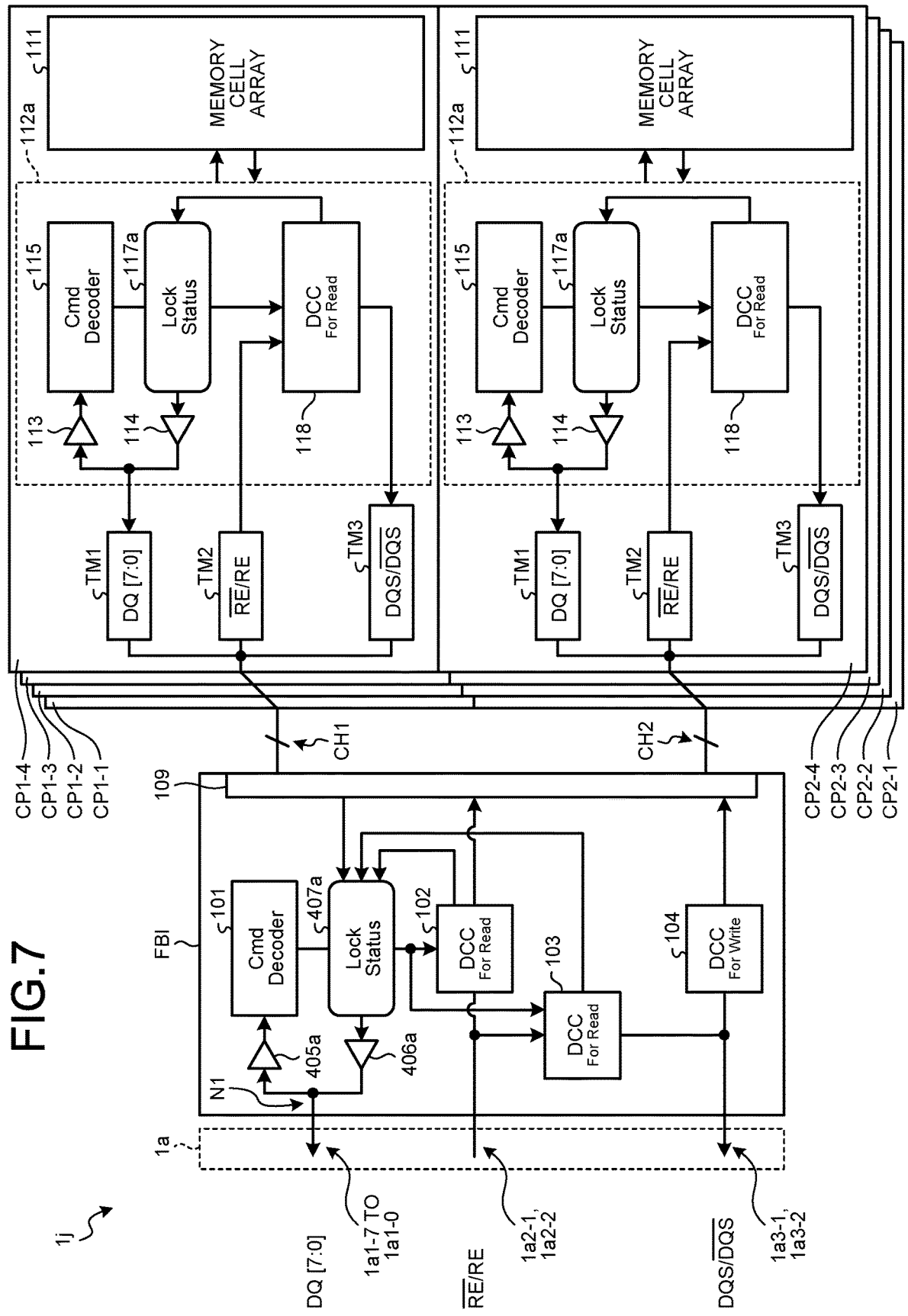
FIG. 7 is a diagram illustrating the configuration of a semiconductor apparatus according to a fourth embodiment.

Specifically, as illustrated in FIG. 7, in the semiconductor apparatus 1j, an interface chip FBI further has a receiver 405a, a driver 406a, and a lock status (Lock Status) notification circuit 407a. FIG. 7 is a diagram illustrating the configuration of the semiconductor apparatus 1j.

The receiver 405a is arranged between a node group N1 and a command decoder 101. When receiving a command from the host HA, the receiver 405a transfers such a command to the command decoder 101.

The lock status notification circuit 407a is arranged among the command decoder 101, the driver 406a, a read DCC 102, and a read DCC 103. The lock status notification circuit 407a has a status register and a generation circuit. The lock status notification circuit 407a ensures a first address and a second address in the status register. The first address is a register address for storing status information indicating the progress of calibration operation of the read DCC 102. The second address is a register address for storing status information indicating the progress of calibration operation of the read DCC 103. In response to, e.g., a decode result for instructing the start of the calibration operation from the command decoder 101, the lock status notification circuit 407a stores a default value in the first address and the second address in the status register. Such a default value may be a value indicating that locking of the DCC is not completed yet.

The read DCC 102 performs the calibration operation of the DCC, and may notify the lock status notification circuit 407a of the progress of such calibration operation. In response to notification of completion of the calibration operation from the read DCC 102, the lock status notification circuit 407a changes the value stored in the first address in the status register from the default value to an effective value. Such an effective value may be a value indicating that locking of the DCC has been completed.

Similarly, the read DCC 103 performs the calibration operation of the DCC, and may notify the lock status notification circuit 407a of the progress of such calibration operation. In response to notification of completion of the calibration operation from the read DCC 103, the lock status notification circuit 407a changes the value stored in the second address in the status register from the default value to an effective value. Such an effective value may be a value indicating that locking of the DCC has been completed.

When the effective value is stored in both of the first address and the second address in the status register, the lock status notification circuit 407a generates the passcode for the interface chip FBI by the generation circuit, thereby outputting the passcode to the driver 406a. The passcode for the interface chip FBI may be a code (i.e., a bit pattern) indicating that locking of each DCC in the interface chip FBI has been completed.

The driver 406a is arranged between the node group N1 and the lock status notification circuit 407a. When receiving the passcode for the interface chip FBI from the lock status notification circuit 407a, the driver 406a transmits such a passcode to the host HA by way of the node group N1 and terminals 1a1-7 to 1a1-0. Accordingly, the host HA receives the passcode for the interface chip FBI, and according to such a passcode, may recognize that locking of each DCC in the interface chip FBI has been completed.

In each memory chip CP1 connected to a channel CH1, a peripheral circuit 112a further has a lock status notification circuit 117a.

The lock status notification circuit 117a is arranged among a command decoder 115, a driver 114, and a read DCC 118. The lock status notification circuit 117a has a status register and a generation circuit. The lock status notification circuit 117a ensures a predetermined address in the status register. The predetermined address is a register address for storing status information indicating the progress of calibration operation of the read DCC 118. In response to, e.g., a decode result for instructing the start of the calibration operation from the command decoder 115, the lock status notification circuit 117a stores a default value in the predetermined address in the status register. Such a default value may be a value indicating that locking of the DCC is not completed yet.

The read DCC 118 performs the calibration operation of the DCC, and may notify the lock status notification circuit 117a of the progress of such calibration operation. In response to notification of completion of the calibration operation from the read DCC 118, the lock status notification circuit 117a changes the value stored in the predetermined address in the status register from the default value to an effective value. Such an effective value may be a value indicating that locking of the DCC has been completed.

When the effective value is stored in the predetermined address in the status register, the lock status notification circuit 117a generates a passcode for the memory chip CP1 by the generation circuit, thereby outputting the passcode to the driver 114. The passcode for the memory chip CP1 may be a code (i.e., a bit pattern) indicating that locking of the DCC in the memory chip CP1 has been completed. When receiving the passcode for the memory chip CP1 from the lock status notification circuit 117a, the driver 114 transmits such a passcode to the interface chip FBI by way of a terminal group TM1 and the channel CH1.

In the lock status notification circuit 407a, when receiving the passcode for the memory chip CP1, the channel interface circuit 109 transfers such a passcode to the lock status notification circuit 407a. The lock status notification circuit 407a outputs the transferred passcode to the driver 406a. The driver 406a transmits such a passcode to the host HA by way of the node group N1 and the terminals 1a1-7 to 1a1-0. Accordingly, the host HA receives the passcode for the memory chip CP1, and according to such a passcode, may recognize that locking of the DCC in the memory chip CP1 has been completed.

Note that as in each memory chip CP1 connected to the channel CH1, the same also applies to each memory chip CP2 connected to a channel CH2.

Figure 8A:
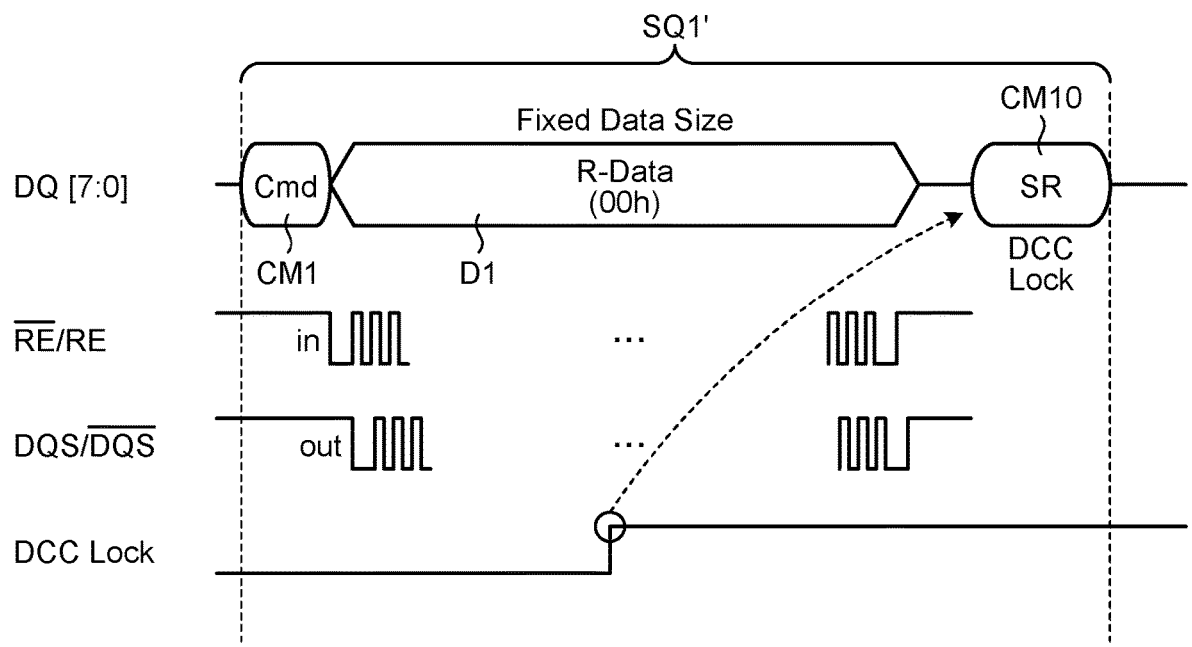
FIGS. 8A and 8B are waveform charts illustrating operation of the semiconductor apparatus according to the fourth embodiment.

Suppose that as indicated by "Fixed Data Size" in FIG. 8A, the length of a period in which the interface chip FBI returns the dummy data D1 to the host HA is determined in advance in a fixed manner as sufficient time for locking of the DCC, for example. FIG. 8A is a waveform chart illustrating operation (a training+confirmation sequence SQ1') of the semiconductor apparatus in a case where the length of the data D1 is determined in a fixed manner. In this case, there is a probability that the length of the period for the data D1 is considerably longer than a time length until the DCC is actually locked. Moreover, for confirming that the DCC is actually locked, the host HA issues a status read command CM10 to the semiconductor apparatus, and makes such confirmation by receiving a response from the semiconductor apparatus. There is a probability that the time of the training+confirmation sequence SQ1' is much more considerably longer than the time length until the DCC is actually locked.

Figure 8B:
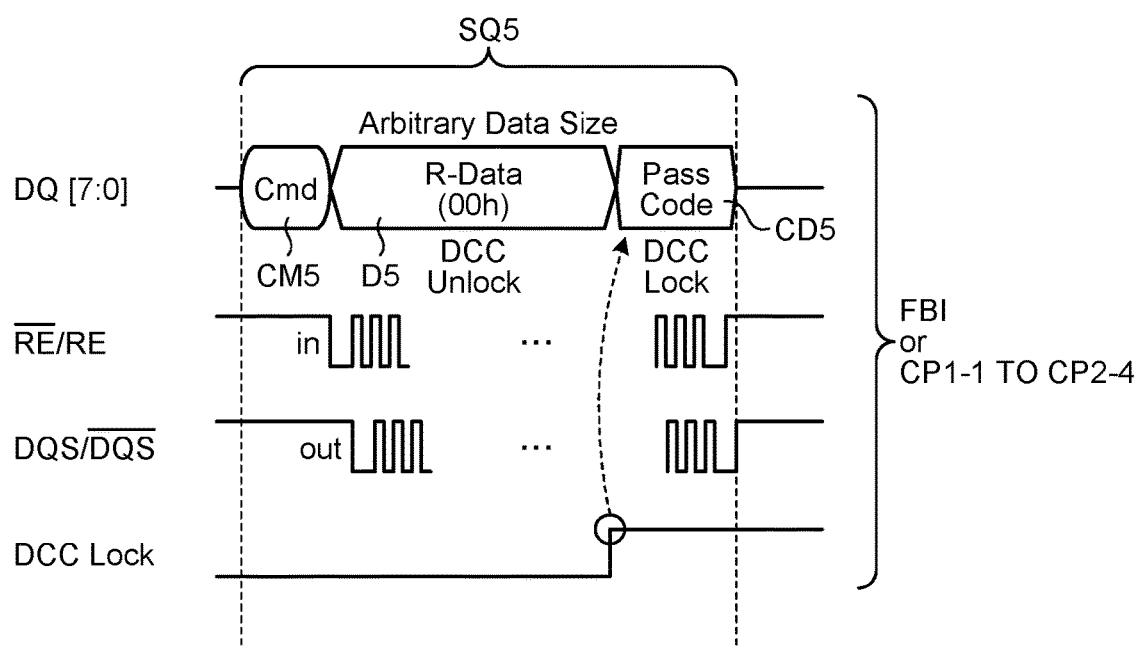

On the other hand, in the fourth embodiment, each chip performs, as illustrated in FIG. 8B, such control that a passcode (Pass Code) CD5 indicating the progress (Status) of determination on whether or not the DCC has been locked is on a data signal DQ[7:0] in execution of a training+confirmation sequence SQ5 corresponding to a calibration command CM5. FIG. 8B is a waveform chart illustrating operation (the training+confirmation sequence SQ5) of the semiconductor apparatus 1j according to the fourth embodiment. In a period from the start to the end of the output of a strobe signal DQS/DQS⁻ adjusted by the DCC 104 or 118, each of the chips FBI, CP1, and CP2 may notify, at the timing of locking the DCC 102, 103, or 118 in the target chip, the host HA of such a lock state by means of the passcode CD5. For example, in a data pattern on the data signal DQ[7:0], the length of a period in which the interface chip FBI returns dummy data D5 to the host HA is an optional length in an Unlock state as indicated by "Arbitrary Data Size." Moreover, the data pattern on the data signal DQ[7:0] may be a pattern indicating the passcode CD5 when the DCC is brought into the lock state. The pattern of the passcode CD5 may be different among the chips. Each chip may output the passcode of the chip itself in a period in which no other passcodes are on the data signal DQ[7:0] (e.g., each chip of each channel outputs the passcode in a time division manner). In the period from the start to the end of the output of the strobe signal DQS/DQS⁻ adjusted by the DCC 104, the interface chip FBI outputs the passcode CD5 for the interface chip FBI itself to the host HA by way of an external terminal group 1a after the DCCs 102 and 103 have been locked. Moreover, in the period from the start to the end of the output of the strobe signal DQS/DQS⁻ adjusted by the DCC 118, the memory chip outputs the passcode CD5 for the memory chip itself to the interface chip FBI after the DCC 118 has been locked. In response to the passcode CD5 received from the memory chip by way of the channel interface circuit 109, the interface chip FBI outputs such a passcode CD5 to the host HA by way of the external terminal group 1a. Accordingly, in a case where the DCC is locked within a shorter period than a set period, the host HA may recognize the lock state of the DCC in each chip, and for each chip, may promptly stop the training sequence SQ5. With this configuration, DCC training time may be considerably shortened.

As described above, in the fourth embodiment, the single chip converts the status information indicating the progress of the calibration operation of the DCC into the passcode identifiable in the host HA, and the dummy data is returned to the host HA with part of the dummy data being replaced with the passcode. With this operation, in a case where the DCC is locked within the shorter period than the set period, training may be promptly stopped, and therefore, the time of the DCC training+confirmation sequence may be shortened for each chip as compared to fixed sequence time.

The calibration command CM5 may be the same as a training command number upon individual execution. In this case, a register that switches between a collective execution mode and an individual execution mode and a chip group to be validated in the collective execution mode may be set in advance by a set feature command.

Fifth Embodiment

Next, a semiconductor apparatus 1k according to a fifth embodiment will be described. Hereinafter, differences from the first to fourth embodiments will be mainly described.

The fourth embodiment has described, as an example, the control performed for the single chip to promptly notify the host HA side of completion of locking of the DCC during execution of training. However, in a fifth embodiment, such control is collectively executed for all chips.

That is, in the fifth embodiment, a circuit that stops the output of a data strobe signal DQS/DQS⁻ is added to each memory chip as in the first embodiment. Further, a circuit that sets a flag to one bit of the output of a data signal DQ[7:0] at the timing of locking a DCC in the target chip is added. The control of assigning each bit to each stacked chip such that one bit is output at a time and avoiding short-circuit of the output of the data signal DQ in each memory chip is performed.

Figure 9:
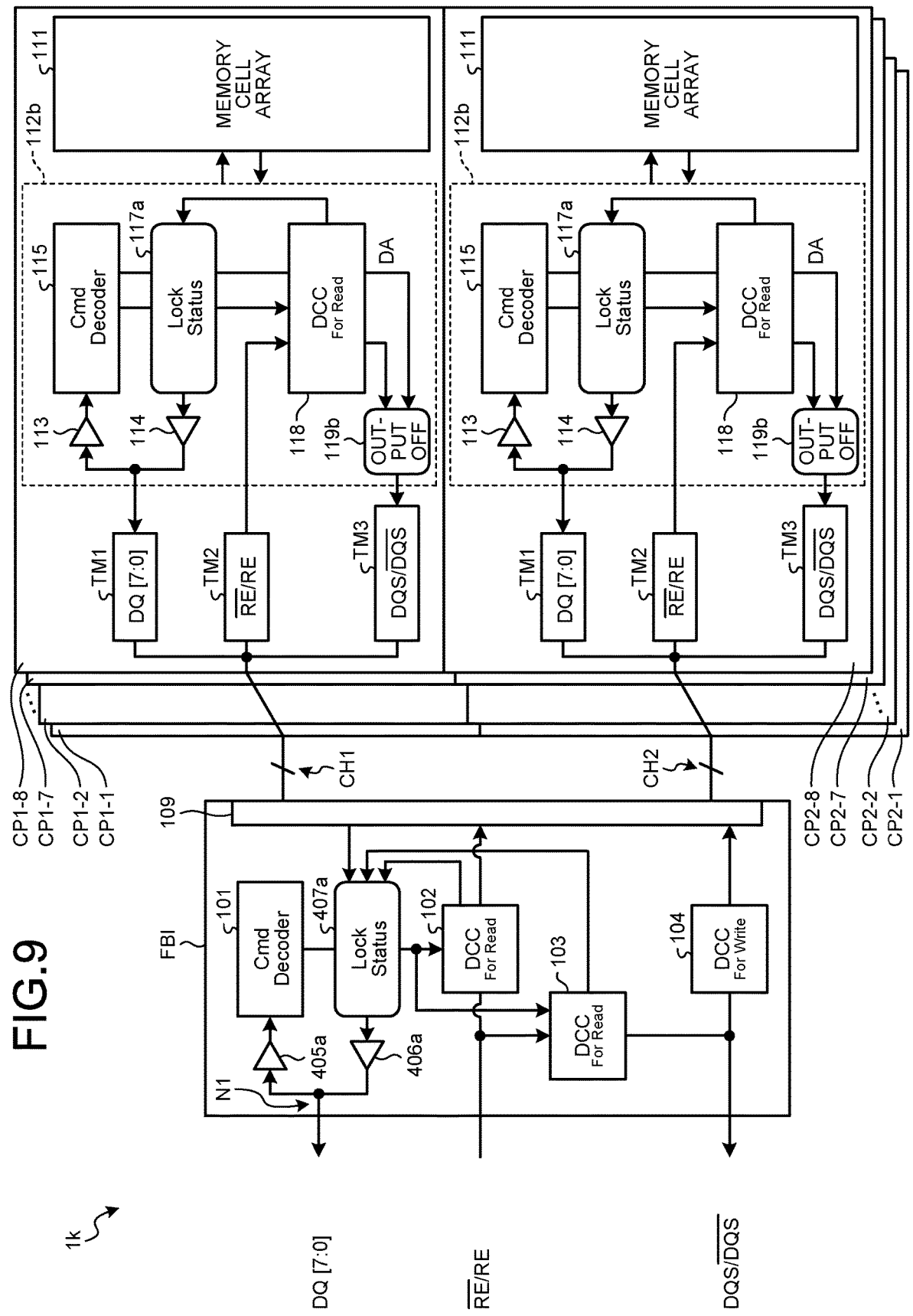
FIG. 9 is a diagram illustrating the configuration of a semiconductor apparatus according to a fifth embodiment.

Specifically, as illustrated in FIG. 9, in the semiconductor apparatus 1k, a peripheral circuit 112b of each of memory chips CP1 and CP2 further has an output cutoff (OUTPUT OFF) circuit 119b. FIG. 9 is a diagram illustrating the configuration of the semiconductor apparatus 1k.

The output cutoff circuit 119b is arranged between a terminal group TM3 and a read DCC 118. The output cutoff circuit 119b receives, from the read DCC 118, an adjusted read enable signal RE⁻/RE and a disable signal DA. In a period in which the disable signal DA is at a non-active level, the output cutoff circuit 119b outputs, as the data strobe signal DQS/DQS⁻, the adjusted read enable signal RE⁻/RE to the terminal group TM3. In a period in which the disable signal DA is at an active level, the output cutoff circuit 119b stops the output of the data strobe signal DQS/DQS⁻ to the terminal group TM3.

For each of memory chips CP1-1 to CP1-8 connected to a channel CH1, each bit in the data signal DQ[7:0] is assigned as a bit to be used. A lock status notification circuit 407a generates, for each of the memory chips CP1-1 to CP1-8, a flag for the memory chip CP1 according to notification of completion of calibration operation from the read DCC 118, and sets the flag to the assigned bit. For example, for the memory chip CP1-1, the lock status notification circuit 407a sets the flag to a bit DQ[0]. For the memory chip CP1-2, the lock status notification circuit 407a sets the flag to a bit DQ[1]. For the memory chip CP1-8, the lock status notification circuit 407a sets the flag to a bit DQ[7]. The lock status notification circuit 407a outputs the bit to which the flag has been set to an interface chip FBI by way of a driver 114, a terminal group TM1, and the channel CH1.

Similarly, for each of memory chips CP2-1 to CP2-8 connected to a channel CH2, each bit in the data signal DQ[7:0] is assigned as a bit to be used. The lock status notification circuit 407a generates, for each of the memory chips CP2-1 to CP2-8, a flag for the memory chip CP2 according to notification of completion of calibration operation from the read DCC 118, and sets the flag to the assigned bit. For example, for the memory chip CP2-1, the lock status notification circuit 407a sets the flag to a bit DQ[0]. For the memory chip CP2-2, the lock status notification circuit 407a sets the flag to a bit DQ[1]. For the memory chip CP2-8, the lock status notification circuit 407a sets the flag to a bit DQ[7]. The lock status notification circuit 407a outputs the bit to which the flag has been set to the interface chip FBI by way of the driver 114, the terminal group TM1, and the channel CH2.

A channel interface circuit 109 of the interface chip FBI may switch, for example, connection among the channels CH1 and CH2 and the lock status notification circuit 407a in a time division manner. With this operation, notification of whether or not the flag has been turned on for each bit in the data signal DQ[7:0] may be made to the lock status notification circuit 407a substantially in real time. The lock status notification circuit 407a checks whether or not the flag has been turned on for each bit in the data signal DQ[7:0], and when the flag is turned on for all bits, holds an effective value indicating that locking has been completed for all memory chips corresponding to the target channel. When holding the effective value for all of DCCs in the interface chip FBI, the DCCs of all memory chips CP1 of the channel CH1, and the DCCs of all memory chips CP2 of the channel CH2, the lock status notification circuit 407a generates a passcode indicating that locking has been completed in all chips, thereby outputting the passcode to a driver 406a. The driver 406a transmits such a passcode to the host HA by way of a node group N1 and terminals 1a1-7 to 1a1-0. Accordingly, the host HA receives the passcode, and according to such a passcode, may recognize that locking of the DCC has been completed in all chips.

Figure 10:
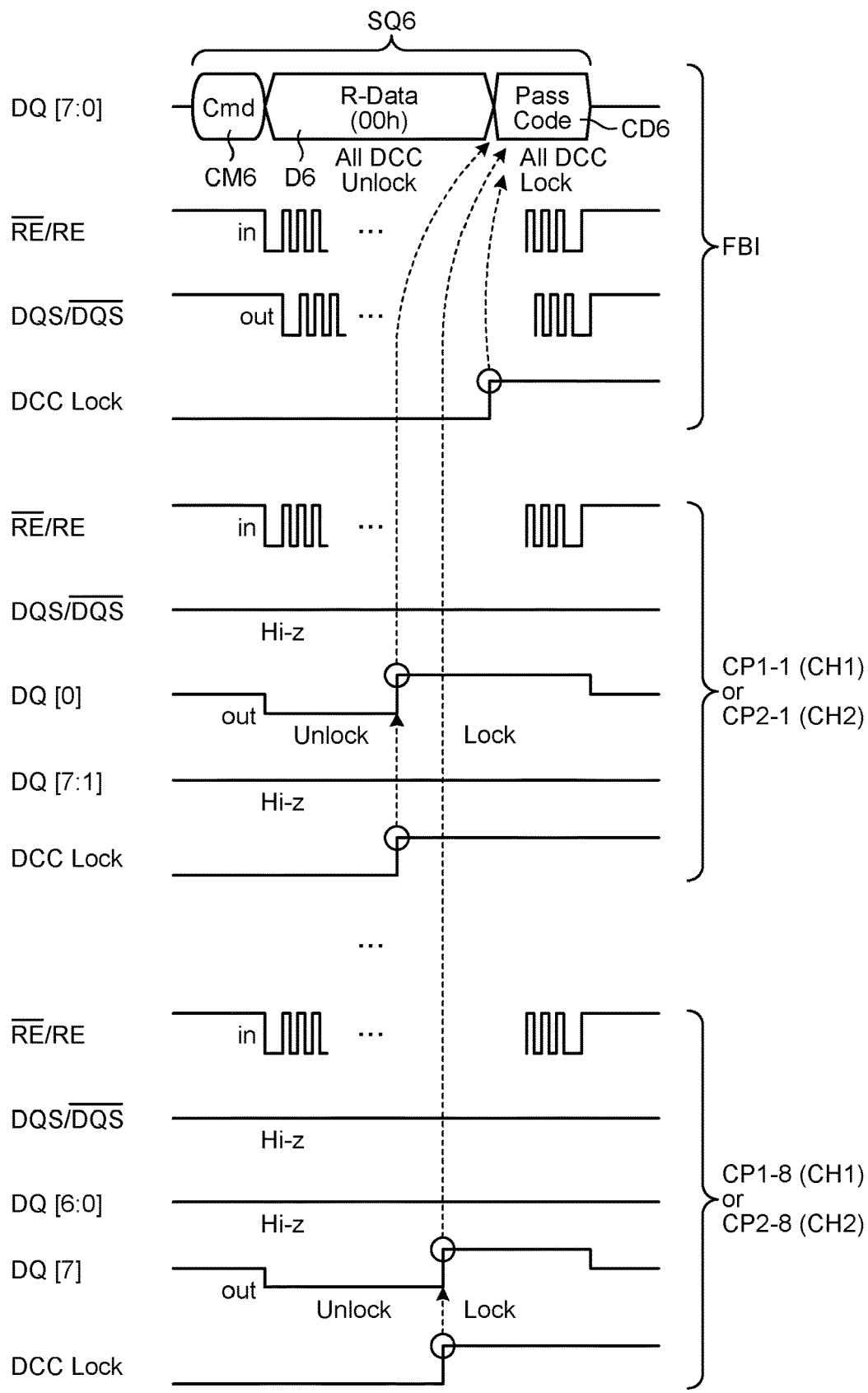
FIG. 10 is a waveform chart illustrating operation of the semiconductor apparatus according to the fifth embodiment.

For example, each chip performs, as illustrated in FIG. 10, such control that status information indicating the progress of Lock of the DCC is on the data signal DQ[7:0] in execution of a training+confirmation sequence SQ6 corresponding to a calibration command CM6. FIG. 10 is a waveform chart illustrating operation (the training+confirmation sequence SQ6) of the semiconductor apparatus 1k according to the fifth embodiment.

According to the calibration command CM6, the interface chip FBI starts the calibration operation of the DCC, and transmits dummy data D6 to the host HA. When the DCC is locked in the interface chip FBI, the interface chip FBI holds, in the lock status notification circuit 407a, the effective value indicating that the DCC in the interface chip FBI has been locked.

According to the calibration command CM6, the memory chip CP1-1 starts the calibration operation of the DCC. The memory chip CP1-1 changes the flag to a default value (Unlock) and sets such a flag to the bit DQ[0], and brings each of other bits DQ[7:1] of the data signal DQ[7:0] and the data strobe signal DQS/DQS⁻ into a high-impedance state. The memory chip CP1-1 changes the flag to the effective value (Lock) at the timing of locking the DCC in the memory chip CP1-1, and sets such a flag to the bit DQ[0]. At this point, the memory chip CP1-1 maintains the other bits DQ[7:1] of the data signal DQ[7:0] in the high-impedance state.

According to the calibration command CM6, the memory chip CP1-8 starts the calibration operation of the DCC. The memory chip CP1-8 changes the flag to the default value (Unlock) and sets such a flag to the bit DQ[7], and brings each of other bits DQ[6:0] of the data signal DQ[7:0] and the data strobe signal DQS/DQS⁻ into the high-impedance state. The memory chip CP1-8 changes the flag to the effective value (Lock) at the timing of locking the DCC in the memory chip CP1-8, and sets such a flag to the bit DQ[7]. At this point, the memory chip CP1-8 maintains the other bits DQ[6:0] of the data signal DQ[7:0] in the high-impedance state.

When the effective value of the flag is set (the flag is turned on) for all bits DQ[0] to DQ[7] in a state in which the channel CH1 and the lock status notification circuit 407a are connected to each other, the interface chip FBI holds, in the lock status notification circuit 407a, the effective value indicating that the DCCs of all of the memory chips CP1-1 to CP1-8 connected to the channel CH1 have been locked.

Moreover, according to the calibration command CM6, the memory chip CP2-1 starts the calibration operation of the DCC. The memory chip CP2-1 changes the flag to the default value (Unlock) and sets such a flag to the bit DQ[0], and brings each of the other bits DQ[7:1] of the data signal DQ[7:0] and the data strobe signal DQS/DQS⁻ into the high-impedance state. The memory chip CP2-1 changes the flag to the effective value (Lock) at the timing of locking the DCC in the memory chip CP2-1, and sets such a flag to the bit DQ[0]. At this point, the memory chip CP2-1 maintains the other bits DQ[7:1] of the data signal DQ[7:0] in the high-impedance state.

According to the calibration command CM6, the memory chip CP2-8 starts the calibration operation of the DCC. The memory chip CP2-8 changes the flag to the default value (Unlock) and sets such a flag to the bit DQ[7], and brings each of the other bits DQ[6:0] of the data signal DQ[7:0] and the data strobe signal DQS/DQS⁻ into the high-impedance state. The memory chip CP2-8 changes the flag to the effective value (Lock) at the timing of locking the DCC in the memory chip CP2-8, and sets such a flag to the bit DQ[7]. At this point, the memory chip CP2-8 maintains the other bits DQ[6:0] of the data signal DQ[7:0] in the high-impedance state.

When the effective value of the flag is set (the flag is turned on) for all bits DQ[0] to DQ[7] in a state in which the channel CH2 and the lock status notification circuit 407a are connected to each other, the interface chip FBI holds, in the lock status notification circuit 407a, the effective value indicating that the DCCs of all of the memory chips CP2-1 to CP2-8 connected to the channel CH2 have been locked. When holding the effective value indicating completion of locking of the DCC for all of the DCCs in the interface chip FBI, the DCCs of all memory chips CP1-1 to CP1-8 connected to the channel CH1, and the DCCs of all memory chips CP2-1 to CP2-8 connected to the channel CH2, the lock status notification circuit 407a generates a passcode CD6 indicating that all DCCs have been locked, thereby outputting the passcode CD6 to the host HA. Accordingly, the host HA receives the passcode, and according to such a passcode, may recognize that locking of the DCCs in all chips has been completed.

In this way, in the training sequence SQ6 illustrated in FIG. 10, in each memory chip, the flag is selectively output to the assigned bit of the bits in the data signal DQ[7:0] after reception of the calibration command CM6, and the output of the other bits is stopped. The value of the flag indicates the progress of the calibration operation of the DCC, the default value of the flag indicates that locking is not completed yet, and the effective value of the flag indicates that locking has been completed. The interface chip monitors each bit in the data signal DQ[7:0], and at the timing of turning on the flag for each bit, generates the passcode for the chip corresponding to such a bit and transmits the passcode to the host HA. With this operation, in a case where the DCC is locked within a shorter period than a set period, such a situation may be notified to the host HA substantially in real time, and for all chips, the host HA may collectively execute prompt stop of training.

As described above, in the fifth embodiment, the multiple chips return, in parallel with each other, the status information indicating the progress of the calibration operation of the DCC to the host HA with the status information being replaced with part of the dummy data. Thus, execution and confirmation of the calibration operation of the DCC may be collectively executed for the multiple chips, and training may be promptly stopped in a case where the DCC is locked within the shorter period than the set period. Consequently, the time of the DCC training+confirmation sequence may be further shortened.

Note that the number of memory chips CP1 or CP2 connected to a corresponding one of the channels CH1 and CH2 may be less than the number of bits of the data signal DQ[7:0]. In this case, for each of the channels CH1 and CH2, each of the memory chips CP1 and CP2 connected to the channels CH1 and CH2 may be assigned to one bit in the data signal DQ[7:0], and in each of the memory chips CP1 and CP2, the control of avoiding short-circuit of the output of the data signal DQ on the channels CH1 and CH2 may be also performed.

The calibration command CM6 may be the same as a training command number upon individual execution. In this case, a register that switches between a collective execution mode and an individual execution mode and a chip group to be validated in the collective execution mode may be set in advance by a set feature command.

Sixth Embodiment

Next, a semiconductor apparatus 1r according to a sixth embodiment will be described. Hereinafter, differences from the first to fifth embodiments will be mainly described.

In the fifth embodiment, the number of chips for which instruction and confirmation of the calibration operation of the DCC may be performed for each channel by means of the single command might be limited to equal to or less than the number of bits of the data signal. For example, in a case where the number of bits of the data signal DQ[7:0] is eight bits, the number of chips for which instruction and confirmation of the calibration operation of the DCC may be performed for each channel by means of the single command might be limited to equal to or less than eight.

For this reason, in the sixth embodiment, the output of status information on completion of DCC locking is, for each channel, sequentially performed for multiple memory chips by means of a single command. For example, when a first memory chip performs DCC training to lock a DCC, the status information (e.g., a chip ID) on completion of DCC locking is output onto a data signal DQ[7:0]. That is, the first memory chip checks the status information output onto the data signal DQ[7:0] by the first memory chip itself, and in a case where information on completion of DCC locking is contained in the output status information, outputs a high impedance to the data signal DQ[7:0] to deactivate a terminal group TM3. When recognizing that the status information on completion of DCC locking is on the data signal DQ[7:0], a second memory chip assumes that training of the DCC of the first memory chip has ended, and performs DCC training after the terminal group TM3 of the first memory chip has been deactivated. When a DCC is locked, the second memory chip outputs status information on completion of DCC locking onto the data signal DQ[7:0]. That is, the second memory chip checks the status information output onto the data signal DQ[7:0] by the second memory chip itself, and in a case where information on completion of DCC locking is contained in the output status information, outputs a high impedance to the data signal DQ[7:0] to deactivate a terminal group TM3. When recognizing that the status information on completion of DCC locking is on the data signal DQ[7:0], a third memory chip assumes that training of the DCC of the second memory chip has ended, and performs DCC training after the terminal group TM3 of the second memory chip has been deactivated. Such control is, for each channel, sequentially performed for the multiple memory chips. When the status information is output from the last memory chip, an interface chip generates a passcode in association with locking of a DCC in the interface chip, and transmits the passcode to a host HA. With this configuration, the number of chips for which instruction and confirmation of the calibration operation of the DCC may be performed for each channel by means of the single command may be increased as compared to the number of bits of the data signal.

Figure 11:
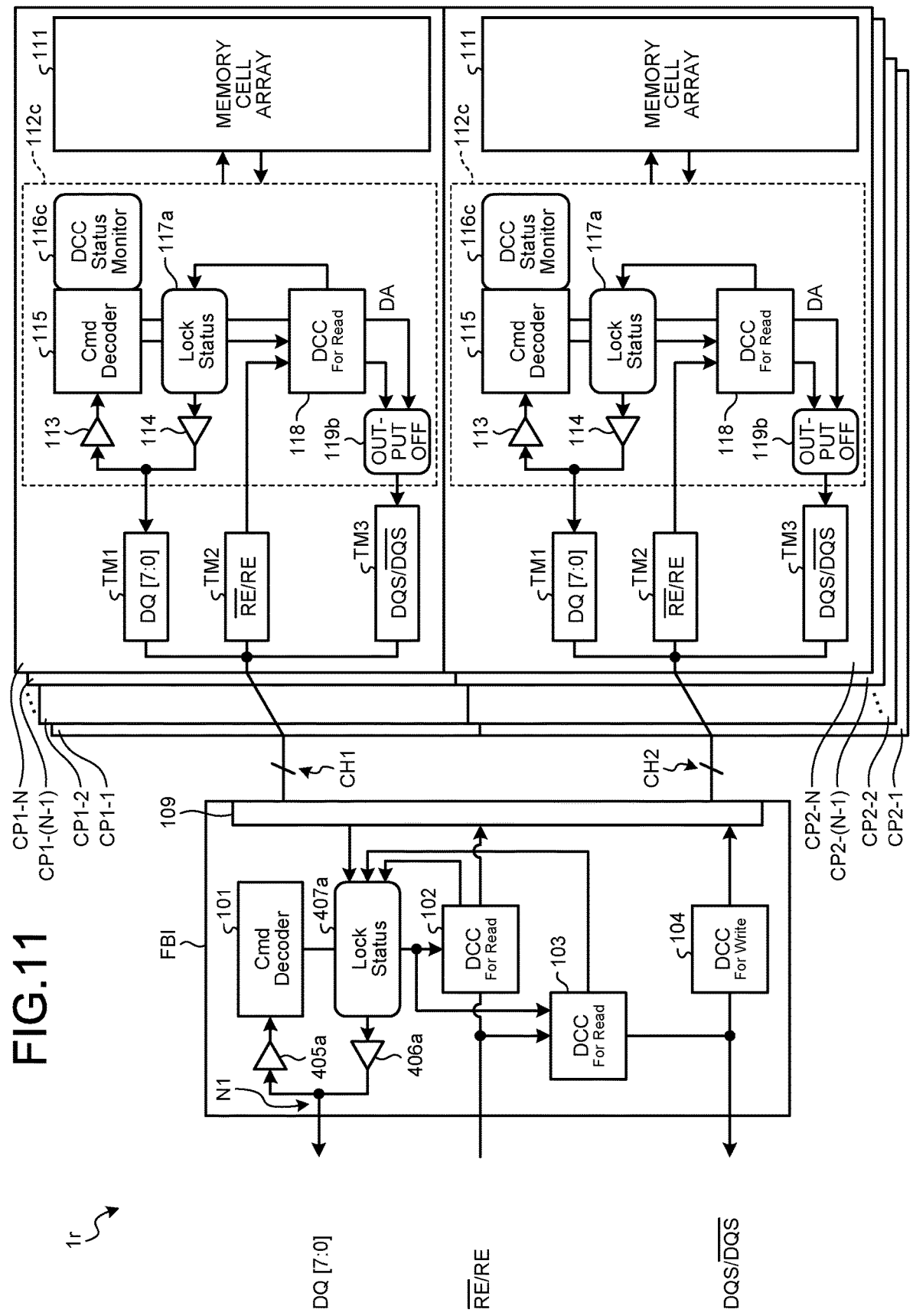
FIG. 11 is a diagram illustrating the configuration of a semiconductor apparatus according to a sixth embodiment.

Specifically, as illustrated in FIG. 11, in the semiconductor apparatus 1r, a peripheral circuit 112c of each of memory chips CP1 and CP2 further has a status monitor (DCC Status Monitor) circuit 116c. FIG. 11 is a diagram illustrating the configuration of the semiconductor apparatus 1r. The status monitor circuit 116c monitors the state of the data signal DQ[7:0] in each of the channels CH1 and CH2.

Suppose that the number of memory chips connected to each of the channels CH1 and CH2 is N (N is an integer of equal to or greater than two). The channel CH1 will be described as an example. Suppose that chip numbers 1 to N are each assigned in advance to memory chips CP1-1 to CP1-N connected to the channel CH1 and checking of the progress of the calibration operation of the DCC according to a calibration command is sequentially performed according to the chip number. In the memory chip CP1, the status monitor circuit 116c monitors whether or not the passcode indicating completion of DCC locking of the previous memory chip is on the data signal DQ[7:0]. When monitoring that the passcode indicating completion of DCC locking of the previous memory chip is present, the status monitor circuit 116c notifies a lock status notification circuit 117a of such a monitoring result by way of a command decoder 115. According to the presence of the passcode indicating completion of DCC locking of the previous memory chip on the data signal DQ[7:0], the lock status notification circuit 117a generates a passcode when the DCC is locked in the target chip, and outputs the passcode to a driver 114. The driver 114 transmits such a passcode to the interface chip FBI by way of a terminal group TM1 and the channel CH1. After a lapse of predetermined time (e.g., time sufficient for the subsequent memory chip to monitor the passcode on the data signal DQ[7:0]), the lock status notification circuit 117a outputs a high impedance to the driver 114. The driver 114 transmits such a high impedance to the terminal group TM1 and the channel CH1. Note that as in the channel CH1, the same also applies to the channel CH2.

A channel interface circuit 109 of the interface chip FBI may switch, for example, connection among the channels CH1 and CH2 and the lock status notification circuit 407*a* in a time division manner. With this operation, the status information on the last memory chips CP1-N and CP2-N connected to the channels CH1 and CH2 may be transferred to the lock status notification circuit 407*a* substantially in real time. When the status information on the last memory chips CP1-N and CP2-N is transferred, the lock status notification circuit 407*a* generates a passcode in association with locking of the DCC in the target chip, and outputs such a passcode to a driver 406*a*. The driver 406*a* transmits such a passcode to the host HA by way of a node group N1 and terminals 1*a*1-7 to 1*a*1-0. Accordingly, the host HA receives the passcode, and according to such a passcode, may recognize that locking of the DCCs in the memory chips CP1 and CP2 and the interface chip FBI has been completed.

Figure 12:
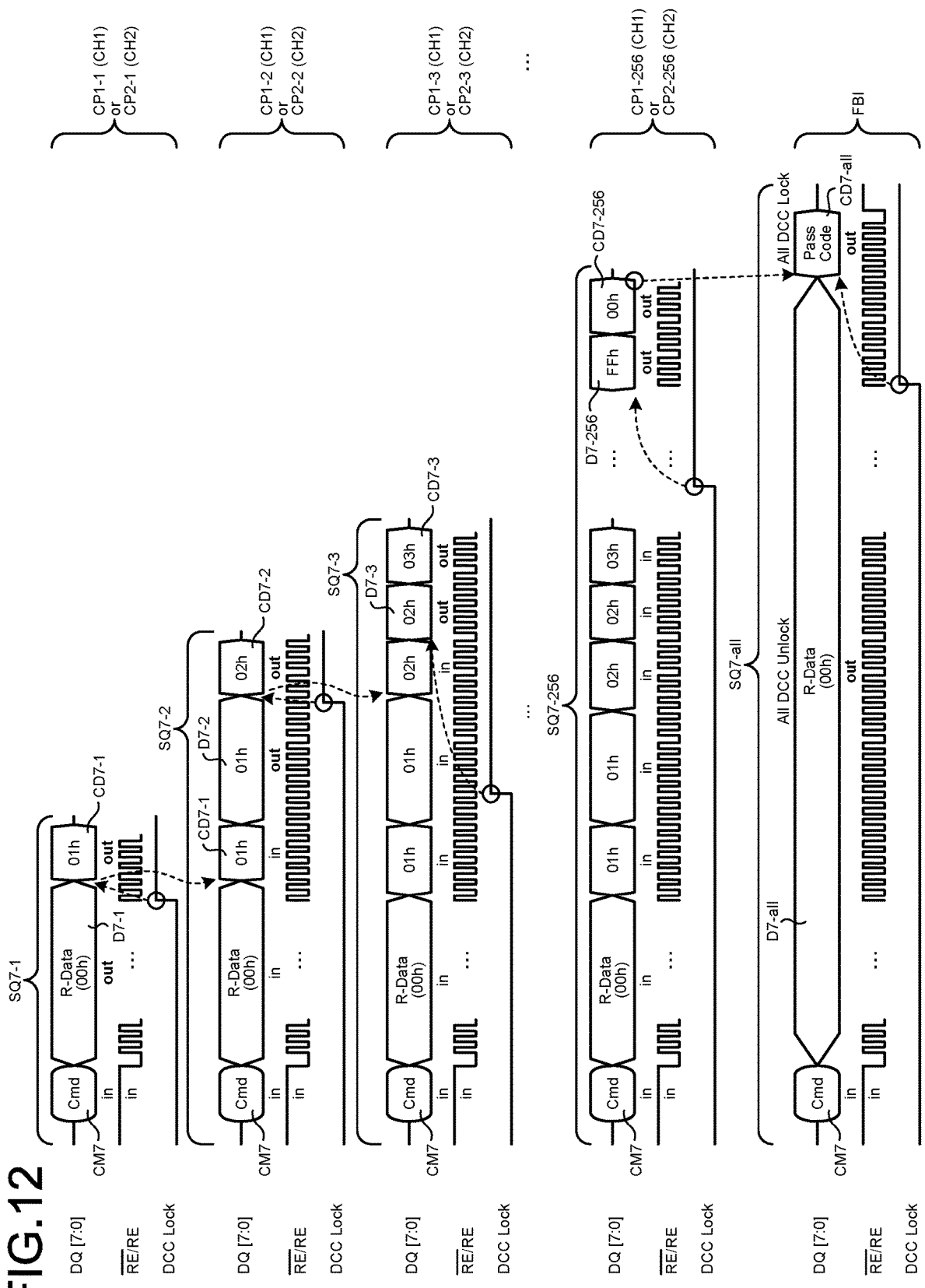
FIG. 12 is a waveform chart illustrating operation of the semiconductor apparatus according to the sixth embodiment.

For example, training+confirmation sequences SQ7-1 to SQ7-N as illustrated in FIG. 12 are performed. FIG. 12 is a waveform chart illustrating operation (the training+confirmation sequence SQ7) of the semiconductor apparatus 1*r* according to the sixth embodiment. Hereinafter, for each of the memory chips CP1-1 to CP1-N connected to the channel CH1 and the interface chip FBI, a sequence in the case of N=256 will be described as an example. The same also applies to each of the memory chips CP2-1 to CP2-N connected to the channel CH2 and the interface chip FBI.

The memory chip CP1-1 outputs, as the data signal DQ[7:0], data D7-1 of all "0" during training, and when training is completed and the DCC is locked, outputs a chip ID of "0x01" as status information CD7-1 for a certain period. Thereafter, a high impedance (Hi-z) is brought.

The memory chip CP1-2 monitors the state of the data signal DQ[7:0] during training, and waits for "0x01" (the status information CD7-1).

After detection of the sequence of the data signal DQ[7:0] from "0x00" to "0x01," the memory chip CP1-2 outputs, if training for the memory chip CP1-2 itself has been completed, a chip ID of "0x02" as status information CD7-2 for a certain period. Thereafter, the high impedance (Hi-z) is brought.

After detection of the sequence of the data signal DQ[7:0] from "0x00" to "0x01," the memory chip CP1-2 outputs, if training for the memory chip CP1-2 itself is not completed yet, the previous memory chip ID of "0x01" as data D7-2. When training is completed and the DCC is locked, the chip ID of "0x02" is output as the status information CD7-2 for a certain period. Thereafter, the high impedance (Hi-z) is brought.

The memory chip CP1-3 monitors the state of the data signal DQ[7:0] during training, and waits for "0x02" (the status information CD7-2).

After detection of the sequence of the data signal DQ[7:0] from "0x01" to "0x02," the memory chip CP1-3 outputs, if training for the memory chip CP1-3 itself has been completed, "0x03" as status information CD7-3 for a certain period. Thereafter, the high impedance (Hi-z) is brought.

After detection of the sequence of the data signal DQ[7:0] from "0x01" to "0x02," the memory chip CP1-3 outputs, if training for the memory chip CP1-3 itself is not completed yet, the previous memory chip ID of "0x02" as data D7-3. When training is completed and the DCC is locked, the chip ID of "0x03" is output as the status information CD7-3 for a certain period. Thereafter, the high impedance (Hi-z) is brought.

The memory chip CP1-256 monitors the state of the data signal DQ[7:0] during training, and waits for "0xFF" (status information CD7-255).

After detection of the sequence of the data signal DQ[7:0] from "0xFE" to "0xFF," the memory chip CP1-256 outputs, if training for the memory chip CP1-256 itself has been completed, "0x00" as status information CD7-256 for a certain period. Thereafter, the high impedance (Hi-z) is brought.

After detection of the sequence of the data signal DQ[7:0] from "0xFE" to "0xFF," the memory chip CP1-256 outputs, if training for the memory chip CP1-256 itself is not completed yet, the previous memory chip ID of "0xFF" as data D7-256. When training is completed and the DCC is locked, the chip ID of "0x00" is output as the status information CD7-256 for a certain period. Thereafter, the high impedance (Hi-z) is brought.

The interface chip FBI monitors the state of the data signal DQ[7:0] during training, and waits for "0x00" (the status information CD7-256).

After detection of the sequence of the data signal DQ[7:0] from "0xFF" to "0x00," the interface chip FBI assumes, if training for the interface chip FBI itself has been completed, that locking of the DCCs of all chips of the channel CH1 and the interface chip FBI itself has been completed. Thus, the interface chip FBI generates a passcode CD7-all, and outputs such a passcode for a certain period. Thereafter, the high impedance (Hi-z) is brought.

After detection of the sequence of the data signal DQ[7:0] from "0xFF" to "0x00," the memory chip CP1-256 continuously outputs dummy data D7-all if training for the memory chip CP1-256 itself is not completed yet. When training is completed and the DCC is locked, the memory chip CP1-256 assumes that locking of the DCCs of all chips of the channel CH1 and the memory chip CP1-256 itself has been completed. Thus, the memory chip CP1-256 generates the "passcode CD7-all, and outputs such a passcode for a certain period. Thereafter, the high impedance (Hi-z) is brought.

As described above, in the sixth embodiment, the output of the status information on completion of DCC locking is, for each channel, sequentially performed for the multiple memory chips by means of the single command. With this operation, the number of chips for which instruction and confirmation of the calibration operation of the DCC may be performed for each channel by means of the single command may be increased as compared to the number of bits of the data signal.

Note that the channel interface circuit 109 of the interface chip FBI may switch, for example, connection among the channels CH1 and CH2 and the lock status notification circuit 407*a* in a time division manner. In this case, the interface chip FBI may check, for each of the channels CH1 and CH2, whether or not the status information CD7-256 has been output onto the data signal DQ[7:0]. If the status information CD7-256 is output onto the data signal DQ[7:0] in a period in which connection is switched to the channel CH1 or CH2, the interface chip FBI holds, in the lock status notification circuit 407*a*, an effective value indicating that locking has been completed for all memory chips corresponding to such a channel. When holding the effective value for all of the DCC in the interface chip FBI, the DCCs of all memory chips CP1 of the channel CH1, and the DCCs of all memory chips CP2 of the channel CH2, the lock status notification circuit 407*a* generates a passcode indicating that locking has been completed in all chips, and outputs such a passcode to the driver 406*a*. The driver 406*a* transmits such a passcode to the host HA by way of the node group N1 and the terminals 1*a*1-7 to 1*a*1-0. Accordingly, the host HA receives the passcode, and according to such a passcode, may recognize that locking of the DCCs in all chips has been completed.

Alternatively, each memory chip may enter, at the moment of completion of the sequence output of such a memory chip itself, a low power consumption mode in which reception of a read enable signal RE⁻/RE is stopped, for example.

A calibration command CM7 may be the same as a training command number upon individual execution. In this case, a register that switches between a collective execution mode and an individual execution mode and a chip group to be validated in the collective execution mode may be set in advance by a set feature command.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor apparatus comprising:
a first chip electrically connected to a terminal to which a signal from a host device is input; and
a second chip electrically connected to the first chip, wherein
the second chip has a first duty adjustment circuit,
the first chip has a second duty adjustment circuit,
the first duty adjustment circuit performs first calibration operation in a first period, the second duty adjustment circuit performs second calibration operation in a second period, and the first period and the second period have an overlapping period,
the second chip has
a data terminal,
a strobe terminal,
a first output cutoff circuit that may deactivate the data terminal, and
a second output cutoff circuit that may deactivate the strobe terminal, and
in a state in which the first output cutoff circuit deactivates the data terminal and the second output cutoff circuit deactivates the strobe terminal, the first duty adjustment circuit performs the first calibration operation, and the second duty adjustment circuit performs the second calibration operation.

2. The semiconductor apparatus according to claim 1, wherein
the second chip further has a read enable terminal, and
in the state in which the first output cutoff circuit deactivates the data terminal and the second output cutoff circuit deactivates the strobe terminal, the first duty adjustment circuit performs the first calibration operation in the first period by means of a signal received via the read enable terminal.

3. The semiconductor apparatus according to claim 1, further comprising:
a third chip electrically connected to the first chip, wherein
the third chip has
a third duty adjustment circuit,
a data terminal,
a strobe terminal,
a third output cutoff circuit that may deactivate the data terminal, and
a fourth output cutoff circuit that may deactivate the strobe terminal,
the second chip is electrically connected to the first chip via a first channel,
the third chip is electrically connected to the first chip via a second channel, and
in a state in which the third output cutoff circuit deactivates the data terminal and the fourth output cutoff circuit deactivates the strobe terminal, a third period in which third calibration operation is performed by the third duty adjustment circuit does not overlap with the first period.

4. The semiconductor apparatus according to claim 3, wherein
the second chip further has a read enable terminal,
in the state in which the first output cutoff circuit deactivates the data terminal and the second output cutoff circuit deactivates the strobe terminal, the first duty adjustment circuit performs the first calibration operation in the first period by means of a signal received via the read enable terminal, and
in the state in which the third output cutoff circuit deactivates the data terminal and the fourth output cutoff circuit deactivates the strobe terminal, the third period in which the third calibration operation is performed by the third duty adjustment circuit does not overlap with the first period.

5. The semiconductor apparatus according to claim 1, wherein
each of the first duty adjustment circuit and the second duty adjustment circuit adjusts a duty of a signal for read operation in the second chip,
the first chip further has a fourth duty adjustment circuit that adjusts a duty of a signal for write operation in the second chip,
the fourth duty adjustment circuit performs fourth calibration operation in a fourth period, and
the first period, the second period, and the fourth period have an overlapping period.

6. The semiconductor apparatus according to claim 5, wherein
the first chip has
an interface circuit electrically connected to the second chip, and
a fifth output cutoff circuit that may electrically cut off the interface circuit from the fourth duty adjustment circuit, and
in a state in which the first output cutoff circuit deactivates the data terminal, the second output cutoff circuit deactivates the strobe terminal, and the fifth output cutoff circuit electrically cuts off the interface circuit from the fourth duty adjustment circuit, the first duty adjustment circuit performs the first calibration operation, the second duty adjustment circuit performs the second calibration operation, and the fourth duty adjustment circuit performs the fourth calibration operation.

7. The semiconductor apparatus according to claim 6, wherein
the second chip further has a read enable terminal, and
in a state in which the first output cutoff circuit deactivates the data terminal and the second output cutoff circuit deactivates the strobe terminal, the first duty adjustment circuit performs the first calibration operation in the first period by means of a signal received via the read enable terminal.

8. The semiconductor apparatus according to claim 1, wherein
the first duty adjustment circuit and the second duty adjustment circuit adjusts a duty of a signal for read operation in the second chip,
the first chip further has a fifth duty adjustment circuit that adjusts a duty of a strobe signal to be supplied to the host device, and
the first duty adjustment circuit performs the first calibration operation, the second duty adjustment circuit performs the second calibration operation, and the fifth duty adjustment circuit performs fifth calibration operation.

9. The semiconductor apparatus according to claim 1, wherein
the first duty adjustment circuit and the second duty adjustment circuit adjusts a duty of a signal for read operation in the second chip,
the first chip further has
a third duty adjustment circuit that adjusts a duty of a signal for write operation in the second chip, and
a fourth duty adjustment circuit that adjusts a duty of a strobe signal to be supplied to the host device,
the fourth duty adjustment circuit performs fourth calibration operation in a fourth period, and
the first period, the second period, and the fourth period have an overlapping period.

10. The semiconductor apparatus according to claim 9, wherein
the data terminal is a first data terminal,
the strobe terminal is a first strobe terminal,
the first output cutoff circuit may deactivate the first data terminal,
the second output cutoff circuit may deactivate the first strobe terminal,
the first chip has
a second data terminal,
a second strobe terminal,
a channel interface circuit connectable to multiple channels,
a third output cutoff circuit that may electrically cut off the channel interface circuit from the third duty adjustment circuit, and
a fourth output cutoff circuit that may electrically cut off the second strobe terminal from the fourth duty adjustment circuit, and
in a state in which the first output cutoff circuit deactivates the first data terminal, the second output cutoff circuit deactivates the first strobe terminal, the third output cutoff circuit electrically cuts off the channel interface circuit from the third duty adjustment circuit, and the fourth output cutoff circuit electrically cuts off the second strobe terminal from the fourth duty adjustment circuit, the first duty adjustment circuit performs the first calibration operation, the second duty adjustment circuit performs the second calibration operation, the third duty adjustment circuit performs third calibration operation in a third period, the fourth duty adjustment circuit performs fourth calibration operation, and the first period, the second period, the third period, and the fourth period have an overlapping period.

11. The semiconductor apparatus according to claim 10, wherein
the second chip further has a first read enable terminal, the first chip further has a second read enable terminal, and
in the state in which the first output cutoff circuit deactivates the first data terminal, the second output cutoff circuit deactivates the first strobe terminal, the third output cutoff circuit electrically cuts off the channel interface circuit from the third duty adjustment circuit, and the fourth output cutoff circuit electrically cuts off the second strobe terminal from the fourth duty adjustment circuit, the first duty adjustment circuit performs the first calibration operation in the first period by means of a signal received via the first read enable terminal, and the second duty adjustment circuit, the third duty adjustment circuit, and the fourth duty adjustment circuit perform the second calibration operation, the third calibration operation, and the fourth calibration operation in the first period by means of a signal received via the second read enable terminal.

12. The semiconductor apparatus according to claim 10, wherein
the first chip further has a fifth output cutoff circuit that may electrically cut off the channel interface circuit from the second data terminal, and
in a state in which the first output cutoff circuit deactivates the first data terminal, the second output cutoff circuit deactivates the first strobe terminal, the third output cutoff circuit electrically cuts off the channel interface circuit from the third duty adjustment circuit, the fourth output cutoff circuit electrically cuts off the second strobe terminal from the fourth duty adjustment circuit, and the fifth output cutoff circuit electrically cuts off the channel interface circuit from the second data terminal, the first duty adjustment circuit performs the first calibration operation, the second duty adjustment circuit performs the second calibration operation, the third duty adjustment circuit performs the third calibration operation, the fourth duty adjustment circuit performs the fourth calibration operation, and the first period, the second period, the third period, and the fourth period have an overlapping period.

13. A method of controlling a semiconductor apparatus having a first chip electrically connected to a terminal to which a signal from a host device is input and including a second duty adjustment circuit and multiple second chips electrically connected to the first chip and including a first duty adjustment circuits, the method comprising:
performing first calibration operation in a first period by the first duty adjustment circuit; and
performing second calibration operation in a second period by the second duty adjustment circuit, wherein
the first period and the second period have an overlapping period,
the semiconductor apparatus further has a third chip electrically connected to the first chip and including a third duty adjustment circuit,
in the method, third calibration operation by the third duty adjustment circuit is further performed in a third period, and
the third period does not overlap with the first period.

14. The method according to claim 13, wherein
each second chip has
a data terminal,
a strobe terminal,
a first output cutoff circuit that may deactivate the data terminal, and
a second output cutoff circuit that may deactivate the strobe terminal, the performing the first calibration operation includes
  performing the first calibration operation in the first period by the first duty adjustment circuit in a state in which the first output cutoff circuit deactivates the data terminal and the second output cutoff circuit deactivates the strobe terminal, and
the performing the second calibration operation includes
  performing the second calibration operation in the second period by the second duty adjustment circuit in the state in which the first output cutoff circuit deactivates the data terminal and the second output cutoff circuit deactivates the strobe terminal.

15. The method according to claim 13, wherein
the third chip has
  a third duty adjustment circuit,
  a data terminal,
  a strobe terminal,
  a third output cutoff circuit that may deactivate the data terminal, and
  a fourth output cutoff circuit that may deactivate the strobe terminal,
the second chip is electrically connected to the first chip via a first channel,
the third chip is electrically connected to the first chip via a second channel, and
performing the third calibration operation includes
  performing the third calibration operation in the third period by the third duty adjustment circuit in a state in which the third output cutoff circuit deactivates the data terminal and the fourth output cutoff circuit deactivates the strobe terminal.

* * * * *